US008854583B2

(12) United States Patent
Kubota et al.

(10) Patent No.: US 8,854,583 B2
(45) Date of Patent: Oct. 7, 2014

(54) SEMICONDUCTOR DEVICE AND LIQUID CRYSTAL DISPLAY DEVICE

(75) Inventors: Daisuke Kubota, Kanagawa (JP); Akio Yamashita, Kanagawa (JP); Tetsuji Ishitani, Kanagawa (JP); Tomohiro Tamura, Tokyo (JP); Mayumi Mikami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 195 days.

(21) Appl. No.: 13/075,292

(22) Filed: Mar. 30, 2011

(65) Prior Publication Data
US 2011/0249228 A1    Oct. 13, 2011

(30) Foreign Application Priority Data

Apr. 12, 2010 (JP) ................. 2010-091712

(51) Int. Cl.
| | | |
|---|---|---|
| G02F 1/1333 | (2006.01) | |
| G02F 1/136 | (2006.01) | |
| G02F 1/1334 | (2006.01) | |
| G02F 1/1343 | (2006.01) | |
| G02F 1/139 | (2006.01) | |
| H01L 27/12 | (2006.01) | |

(52) U.S. Cl.
CPC ............ *G02F 1/1334* (2013.01); *G02F 1/1343* (2013.01); *H01L 27/1225* (2013.01); *G02F 1/139* (2013.01)
USPC ............................. 349/138; 349/43; 349/122

(58) Field of Classification Search
USPC ....................... 349/42, 43, 140, 141, 122, 138
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,097,465 A | 8/2000 | Hiroki et al. |
| 6,175,395 B1 | 1/2001 | Yamazaki et al. |
| 6,294,274 B1 | 9/2001 | Kawazoe et al. |

(Continued)

FOREIGN PATENT DOCUMENTS

| | | |
|---|---|---|
| EP | 1 737 044 | 12/2006 |
| EP | 2 226 847 | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Nathanael R Briggs
(74) *Attorney, Agent, or Firm* — Nixon Peabody LLP; Jeffrey L. Costellia

(57) ABSTRACT

In a liquid crystal display device in which a liquid crystal layer exhibiting a blue phase is sandwiched between a first substrate and a second substrate, a pixel electrode layer is electrically connected to a drain electrode layer of a transistor and a common electrode layer is electrically connected to a conductive layer formed through the same steps as the drain electrode layer. The pixel electrode layer and the common electrode layer are over an interlayer film and spaced apart from each other. An opening formed in the interlayer film is filled with liquid crystal, and the liquid crystal layer is formed.

11 Claims, 12 Drawing Sheets

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,327,433 B2 | 2/2008 | Miyachi et al. |
| 7,342,632 B2 | 3/2008 | Miyachi et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,829 B2 | 8/2009 | Kikuchi et al. |
| 7,674,650 B2 | 3/2010 | Akimoto et al. |
| 7,732,819 B2 | 6/2010 | Akimoto et al. |
| 7,816,682 B2 | 10/2010 | Kimura |
| 7,847,904 B2 | 12/2010 | Kimura |
| 7,872,722 B2 | 1/2011 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0179847 A1* | 8/2005 | Miyachi et al. ............... 349/141 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0203169 A1 | 9/2006 | Ozawa et al. |
| 2006/0208977 A1 | 9/2006 | Kimura |
| 2006/0227283 A1 | 10/2006 | Ooi et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126969 A1* | 6/2007 | Kimura et al. ............... 349/141 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0259254 A1 | 10/2008 | Kikuchi et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101908 A1* | 4/2009 | Kwack ............... 257/59 |
| 2009/0114910 A1 | 5/2009 | Chang |
| 2009/0127552 A1* | 5/2009 | Li et al. ............... 257/43 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153761 A1* | 6/2009 | Park et al. ............... 349/43 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0165280 A1 | 7/2010 | Ishitani et al. |
| 2010/0195028 A1 | 8/2010 | Kubota et al. |
| 2010/0245724 A1 | 9/2010 | Nishi et al. |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2007-171938 | 7/2007 |
| JP | 2008-112022 | 5/2008 |
| WO | WO-2004-114391 A1 | 12/2004 |
| WO | WO 2005-090520 A1 | 9/2005 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350°C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9TH International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, p. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al.. "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystaslline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al. "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 5A1 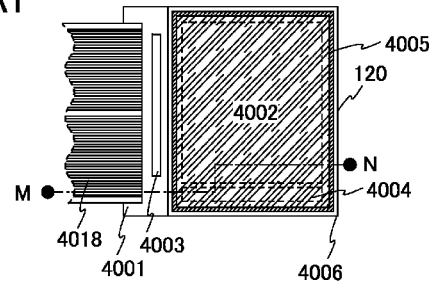
FIG. 5A2 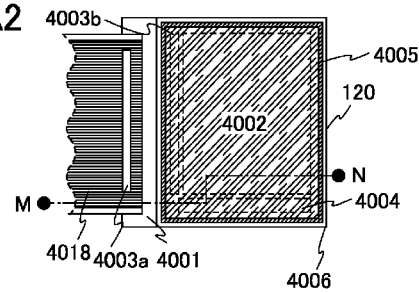

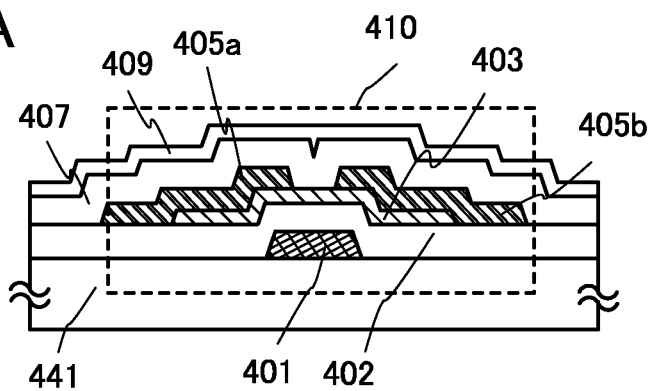
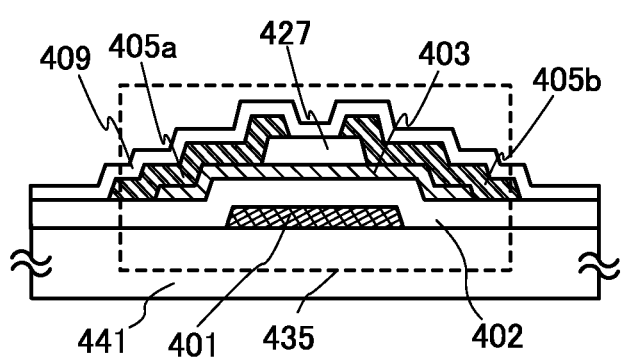
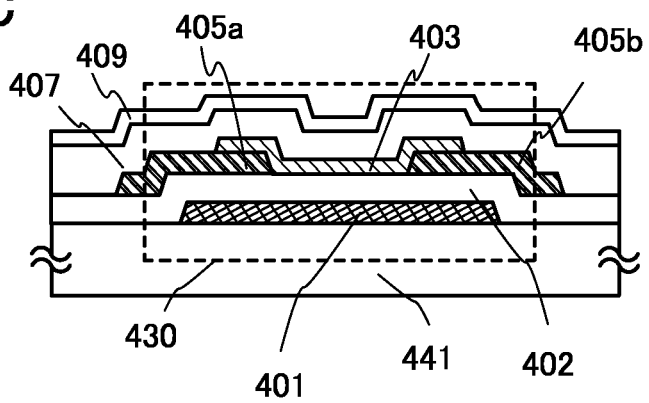
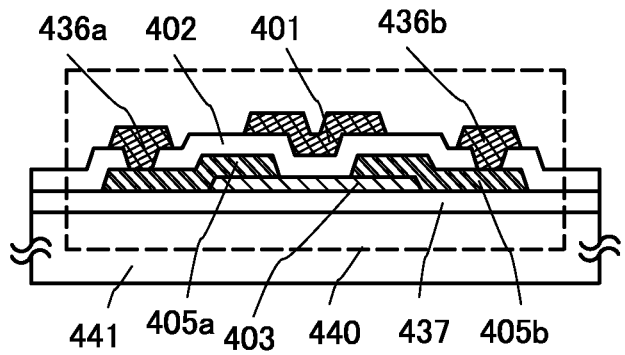

SEMICONDUCTOR DEVICE AND LIQUID CRYSTAL DISPLAY DEVICE

BACKGROUND OF THE INVENTION

1. Field of the Invention

The present invention relates to a semiconductor device and a liquid crystal display device, and a manufacturing method thereof.

2. Description of the Related Art

As a display device which is thin and lightweight (a so-called flat panel display), a liquid crystal display device including a liquid crystal element, a light-emitting device including a self-light-emitting element, a field emission display (an FED), and the like have been competitively developed.

In a liquid crystal display device, response speed of liquid crystal molecules is required to be increased. Among various kinds of display modes of liquid crystal, a ferroelectric liquid crystal (FLC) mode, an optical compensated birefringence (OCB) mode, and a mode using liquid crystal exhibiting a blue phase can be given as liquid crystal modes by which high-speed response is possible.

In particular, the mode using liquid crystal exhibiting a blue phase does not require an alignment film and the viewing angle can be widened; therefore, further research thereon has been carried out for practical use (for example, see Patent Document 1). Patent Document 1 reports that polymer stabilization treatment is performed on liquid crystal so that the temperature range where a blue phase is exhibited is increased.

REFERENCE

Patent Document

[Patent Document 1] PCT International Publication No. 05/090520

SUMMARY OF THE INVENTION

In order to achieve high contrast of a liquid crystal display device, white transmittance (light transmittance in white display) needs to be high.

Therefore, in order to achieve higher contrast, it is an object to provide a liquid crystal display device that is suitable for a liquid crystal display mode using liquid crystal exhibiting a blue phase.

It is another object to achieve a reduction in power consumption of a liquid crystal display device including liquid crystal exhibiting a blue phase.

In an active matrix liquid crystal display device in which a first liquid crystal layer exhibiting a blue phase is sandwiched between a first substrate and a second substrate and in which a plurality of pixels are arranged in matrix, a transistor and a liquid crystal element including a pixel electrode layer, a liquid crystal layer, and a common electrode layer are provided for each pixel. The pixel electrode layer and the common electrode layer are provided over an interlayer film which is provided so as to cover the transistor, and are arranged on the same surface of the interlayer film such that they are not in contact with each other.

The pixel electrode layer and the common electrode layer do not have flat plate-like shapes but have various opening patterns (slits) including a bent portion or a branching comb-like shape. For example, the pixel electrode layer and the common electrode layer each can have a comb-like pattern which does not form a closed space and is opened. In this case, the pixel electrode layer and the common electrode layer can be provided on the same insulating surface (e.g., the same substrate or the same insulating film) such that their comb-like patterns are engaged with each other.

Another common electrode layer may be provided on a counter substrate (the second substrate) side so that a pair of common electrode layers face each other. In this case, a first common electrode layer on the first substrate side and a second common electrode layer (a third electrode layer) on the second substrate side are positioned so as to overlap with each other with the first liquid crystal layer sandwiched therebetween.

In the case of forming the second common electrode layer, the first common electrode layer and the second common electrode layer have substantially the same pattern at least in a pixel region in a plan view and are positioned so as to overlap with each other with the first liquid crystal layer sandwiched therebetween. Note that the first common electrode layer and the second common electrode layer overlap at least partly with each other.

The pixel electrode layer of the liquid crystal element is supplied with a potential of an image signal through a source electrode layer or a drain electrode layer electrically connected to a semiconductor layer of the transistor. On the other hand, the common electrode layers (the first common electrode layer and the second common electrode layer) of the liquid crystal element are supplied with a fixed potential (e.g., a ground potential) serving as a reference with respect to the potential of the image signal supplied to the pixel electrode layer. The common potential is preferably set to a potential around an intermediate potential of an image signal which is transmitted as data in such a level as not to generate flickers. The common electrode layer can operate in a floating state (an electrically isolated state).

The pixel electrode layer is electrically connected to (or supplied with the same potential as) the drain electrode layer of the transistor through an opening of the interlayer film. The common electrode layer is electrically connected to (or supplied with the same potential as) a conductive layer which includes the same material and is formed through the same step as the drain electrode layer. The interlayer film between the pixel electrode layer and the common electrode layer is selectively removed, so that an opening is formed. The opening is filled with liquid crystal, and a second liquid crystal layer is formed.

Therefore, when a voltage is applied between the pixel electrode layer and the common electrode layer, the same voltage can also be applied between the drain electrode layer and the conductive layer. Thus, in the first and second liquid crystal layers, an electric field can be widely formed between the pixel electrode layer and the common electrode layer and also in an opening region between the drain electrode layer and the conductive layer.

An electric field is formed between the pixel electrode layer and the common electrode layer and also between a conductive layer (the drain electrode layer) having the same potential as the pixel electrode layer and the conductive layer having the same potential as the common electrode layer; therefore, an electric field can be formed not only in the first liquid crystal layer but also in the second liquid crystal layer. In such a manner, stacked bodies each including the conductive layer and the electrode layer which have the same potential are formed, whereby an electric field can be widely formed in the liquid crystal layer. Accordingly, liquid crystal molecules can be controlled with the use of the electric field.

In addition, when the second common electrode layer is provided on the second substrate side, an electric field can be applied to liquid crystal in an oblique direction (in a direction oblique to the substrate) between the pixel electrode layer and the second common electrode layer; thus, liquid crystal molecules can be controlled more efficiently.

Therefore, the liquid crystal molecules in the entire liquid crystal layer including a thickness film direction can be made to respond and white transmittance can be improved. Thus, the contrast ratio, which is a ratio of white transmittance to black transmittance (light transmittance in black display), can also be increased. Further, an electric field can be effectively applied even to a liquid crystal material (liquid crystal mixture) exhibiting a blue phase, which has high viscosity; therefore, a reduction in power consumption can also be achieved.

In this specification, a substrate which is provided with a semiconductor element (e.g., a transistor), a pixel electrode layer, a first common electrode layer, and an interlayer film is referred to as an element substrate (a first substrate), and a substrate which faces the element substrate with a liquid crystal layer sandwiched therebetween is referred to as a counter substrate (a second substrate). A second common electrode layer which overlaps with the first common electrode layer may be formed between the counter substrate (the second substrate) and the liquid crystal layer.

A liquid crystal material exhibiting a blue phase is used for the liquid crystal layer. Note that a liquid crystal material refers to a mixture which includes liquid crystal and is used for a liquid crystal layer. The liquid crystal material exhibiting a blue phase has a short response time of 1 msec or less and enables high-speed response, whereby a high-performance liquid crystal display device can be achieved.

The liquid crystal material exhibiting a blue phase includes liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer.

As the liquid crystal, thermotropic liquid crystal, low-molecular liquid crystal, high-molecular liquid crystal, ferroelectric liquid crystal, anti-ferroelectric liquid crystal, or the like is used.

As the chiral agent, a material having a high compatibility with liquid crystal and a strong twisting power is used. Either an R-enantiomer or an S-enantiomer is used, and a racemic mixture in which an R-enantiomer and an S-enantiomer are mixed at 50:50 is not used.

The above liquid crystal material exhibits a cholesteric phase, a cholesteric blue phase, a smectic phase, a smectic blue phase, a cubic phase, a chiral nematic phase, an isotropic phase, or the like depending on conditions.

A cholesteric blue phase and a smectic blue phase, which are blue phases, are observed in a liquid crystal material having a cholesteric phase or a smectic phase with a relatively short helical pitch of 500 nm or less. The alignment of the liquid crystal material has a double twist structure. Having the order of less than or equal to a wavelength of visible light, the liquid crystal material is transparent, and optical modulation action is generated through a change in alignment order by voltage application. A blue phase is optically isotropic and thus has no viewing angle dependence. Thus, an alignment film is not necessarily formed; therefore, display image quality can be improved and cost can be reduced.

The blue phase is exhibited only within a narrow temperature range; therefore, it is preferable that a photocurable resin and a photopolymerization initiator be added to a liquid crystal material and polymer stabilization treatment be performed in order to widen the temperature range. The polymer stabilization treatment is performed in such a manner that a liquid crystal material including liquid crystal, a chiral agent, a photocurable resin, and a photopolymerization initiator is irradiated with light having a wavelength with which the photocurable resin and the photopolymerization initiator are reacted. This polymer stabilization treatment may be performed by irradiating a liquid crystal material in the state of exhibiting an isotropic phase with light or by irradiating a liquid crystal material in the state of exhibiting a blue phase with light under the control of the temperature.

For example, the polymer stabilization treatment is performed in such a manner that the temperature of a liquid crystal layer is controlled and the liquid crystal layer is irradiated with light with a blue phase exhibited. Note that the polymer stabilization treatment is not limited to this manner and may be performed in such a manner that a liquid crystal layer is irradiated with light with an isotropic phase exhibited at a temperature within +10° C., preferably +5° C. from the phase transition temperature between the blue phase and the isotropic phase. The phase transition temperature between the blue phase and the isotropic phase is a temperature at which the phase changes from the blue phase to the isotropic phase when the temperature increases, or a temperature at which the phase changes from the isotropic phase to the blue phase when the temperature decreases. As an example of the polymer stabilization treatment, the following method can be employed: after heating a liquid crystal layer to exhibit the isotropic phase, the temperature of the liquid crystal layer is gradually decreased so that the phase changes to the blue phase, and then, irradiation with light is performed while the temperature at which the blue phase is exhibited is kept. Alternatively, after the phase changes to the isotropic phase by gradually heating a liquid crystal layer, the liquid crystal layer is irradiated with light under a temperature within +10° C., preferably +5° C. of the phase transition temperature between the blue phase and the isotropic phase (with an isotropic phase exhibited). In the case of using an ultraviolet curable resin (a UV curable resin) as the photocurable resin included in the liquid crystal material, the liquid crystal layer may be irradiated with ultraviolet rays. Even in the case where the blue phase is not exhibited, if polymer stabilization treatment is performed by irradiation with light at a temperature within +10° C., preferably +5° C. from the phase transition temperature between the blue phase and the isotropic phase (with an isotropic phase exhibited), the response time can be made as short as 1 msec or less and high-speed response is possible.

One embodiment of a structure of the invention disclosed in this specification is a liquid crystal display device including a first substrate and a second substrate between which a liquid crystal layer including a liquid crystal material exhibiting a blue phase is sandwiched; a transistor including a semiconductor layer and a first conductive layer electrically connected to the semiconductor layer, over the first substrate; a second conductive layer provided on and in contact with the same surface as the first conductive layer, wherein the first conductive layer and the second conductive layer are provided to be apart from each other; an interlayer film over the transistor, the first conductive layer, and the second conductive layer; and a first electrode layer and a second electrode layer which are provided on and in contact with the same surface of the interlayer film, wherein the first electrode layer and the second electrode layer are provided to be apart from each other. The first electrode layer is electrically connected to the first conductive layer, and is stacked over the first conductive layer with the interlayer film sandwiched between the first electrode layer and the first conductive layer. The second electrode layer is electrically connected to the second conductive layer, and is stacked over the second conductive layer with the interlayer film sandwiched between the second electrode layer and the second conductive layer. The interlayer film has an opening between the first electrode layer and the second electrode layer. The liquid crystal layer is provided in the opening.

Another embodiment of a structure of the invention disclosed in this specification is a liquid crystal display device including a first substrate and a second substrate between which a liquid crystal layer including a liquid crystal material exhibiting a blue phase is sandwiched; a transistor including a semiconductor layer and a first conductive layer electrically connected to the semiconductor layer, over the first substrate; a second conductive layer provided on and in contact with the same surface as the first conductive layer, wherein the first conductive layer and the second conductive layer are provided to be apart from each other; an interlayer film over the transistor, the first conductive layer, and the second conductive layer; a first electrode layer and a second electrode layer which are provided on and in contact with the same surface of the interlayer film, wherein the first electrode layer and the second electrode layer are provided to be apart from each other; and a third electrode layer which overlaps with the second electrode layer and is provided between the second substrate and the liquid crystal layer. The first electrode layer is electrically connected to the first conductive layer, and is stacked over the first conductive layer with the interlayer film sandwiched between the first electrode layer and the first conductive layer. The second electrode layer is electrically connected to the second conductive layer, and is stacked over the second conductive layer with the interlayer film sandwiched between the second electrode layer and the second conductive layer. The interlayer film has an opening between the first electrode layer and the second electrode layer. The liquid crystal layer is provided in the opening.

Since the liquid crystal layer exhibiting a blue phase is used, it is not necessary to form an alignment film. Thus, a structure in which a pixel electrode layer (the first electrode layer) is in contact with the liquid crystal layer, and the second electrode layer (the first common electrode layer) is in contact with the liquid crystal layer is obtained. Note that in the case where the third electrode layer (the second common electrode layer) is provided, the third electrode layer (the second common electrode layer) is also in contact with the liquid crystal layer.

Note that the ordinal numbers such as "first" and "second" in this specification are used for convenience and do not denote the order of steps and the stacking order of layers. In addition, the ordinal numbers in this specification do not denote particular names which specify the present invention.

In this specification, a semiconductor device means all types of devices which can function by utilizing semiconductor characteristics, and an electro-optical device, a semiconductor circuit, and an electronic device are all semiconductor devices.

Liquid crystal molecules in the entire liquid crystal layer including a film thickness direction can be made to respond and white transmittance can be improved. In a liquid crystal display device which includes a liquid crystal layer exhibiting a blue phase, the contrast ratio can be increased.

Further, an electric field can be effectively formed even in a liquid crystal layer exhibiting a blue phase, which has high viscosity; therefore, a reduction in power consumption of a liquid crystal display device can also be achieved.

BRIEF DESCRIPTION OF THE DRAWINGS

FIGS. 5A1, 5A2, and 5B illustrate liquid crystal display modules.
FIGS. 7A to 7D each illustrate a transistor which can be applied to a liquid crystal display device.

DETAILED DESCRIPTION OF THE INVENTION

Figure 1A:
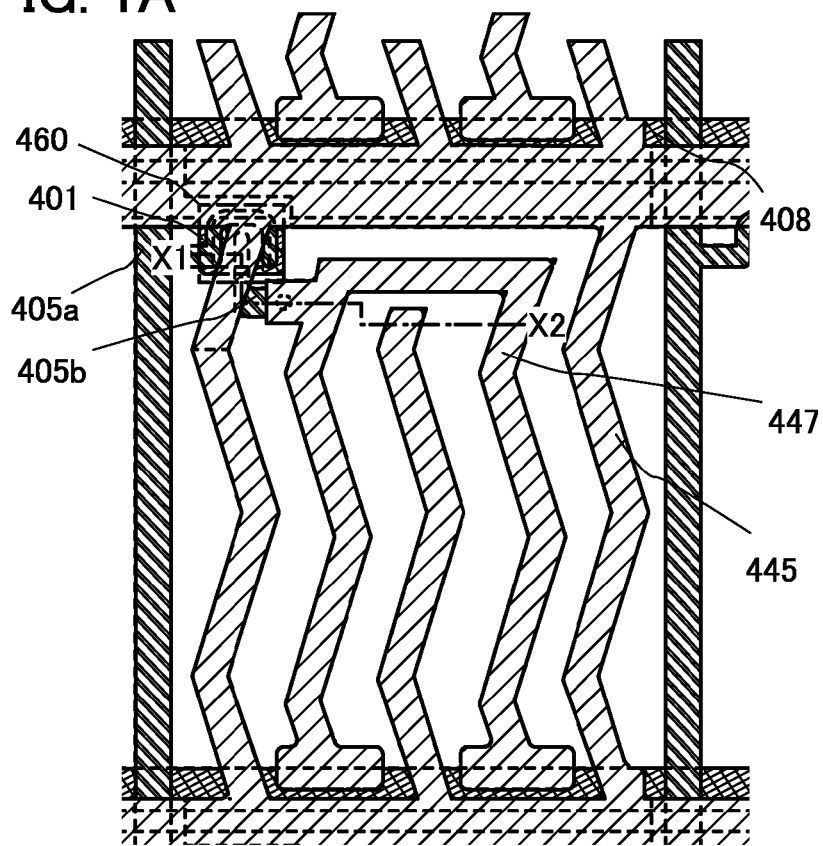
FIGS. 1A and 1B illustrate a liquid crystal display device.

Embodiments will be described in detail with reference to the accompanying drawings. Note that the present invention is not limited to the following description, and it is easily understood by those skilled in the art that various changes may be made in modes and details without departing from the spirit and the scope of the present invention. Therefore, the present invention should not be construed as being limited to the description in the following embodiments. Note that in the structures described below, the same portions or portions having similar functions are denoted by the same reference numerals in different drawings, and explanation thereof will not be repeated.

Embodiment 1

An example of an active matrix liquid crystal display device to which the invention disclosed in this specification is applied will be described with reference to FIGS. 1A and 1B, FIGS. 2A to 2E, FIGS. 4A and 4B, and FIGS. 11A and 11B.

In a liquid crystal display device which includes a liquid crystal layer exhibiting a blue phase, a method in which the gray scale is controlled by generation of an electric field generally parallel (i.e., in a lateral direction) to a substrate to move liquid crystal molecules in a plane parallel to the substrate can be used. In such a method, an electrode structure used in an in-plane switching (IPS) mode can be employed.

In a lateral electric field mode such as an IPS mode, a first electrode layer (e.g., a pixel electrode layer with which voltage is controlled per pixel) having an opening pattern and a second electrode layer (e.g., a common electrode layer with which common voltage is supplied to all pixels) having an opening pattern are positioned below a liquid crystal layer. The first electrode layer and the second electrode layer do not form plane-like shapes but form various opening patterns including a bent portion or a branching comb-like shape. The first electrode layer and the second electrode layer do not overlap with each other, but may have the same shape, in order to generate an electric field between the electrode layers.

By application of an electric field between the pixel electrode layer and the common electrode layer, liquid crystal is controlled. An electric field in a lateral direction is applied to the liquid crystal, so that liquid crystal molecules can be controlled using the electric field. That is, the liquid crystal molecules oriented parallel to the substrate can be controlled in a direction parallel to the substrate; accordingly, the viewing angle can be widened.

Figure 1B:
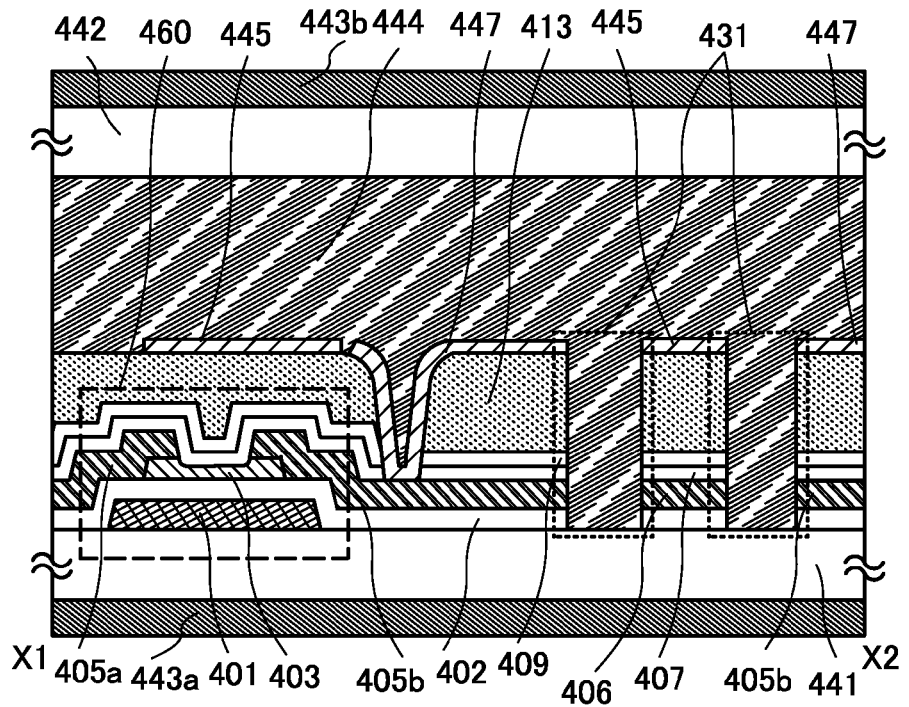

FIG. 1A is a plan view of a liquid crystal display device and illustrates one pixel. FIG. 1B is a cross-sectional view taken along line X1-X2 in FIG. 1A.

In FIG. 1A, a plurality of source wiring layers (including a source electrode layer 405a) are arranged in parallel (extend in the vertical direction in the drawing) to be spaced from each other. A plurality of gate wiring layers (including a gate electrode layer 401) are provided to extend in a direction generally perpendicular to the source wiring layers (the horizontal direction in the drawing) and to be spaced from each other. Capacitor wiring layers 408 are arranged adjacent to the plurality of gate wiring layers and extend in a direction generally parallel to the gate wiring layers, that is, in a direction generally perpendicular to the source wiring layers (in the horizontal direction in the drawing). A space with a generally rectangular shape, which is surrounded by the source wiring layers, the capacitor wiring layers 408, and the gate wiring layers, is provided with a pixel electrode layer and a common electrode layer of the liquid crystal display device. A transistor 460 for driving the pixel electrode layer is provided at an upper left corner of the drawing. A plurality of pixel electrode layers and a plurality of transistors are arranged in matrix.

In the liquid crystal display device of FIGS. 1A and 1B, a first electrode layer 447 functioning as the pixel electrode layer is supplied with a potential of an image signal through the source electrode layer 405a or a drain electrode layer 405b electrically connected to a semiconductor layer 403 of the transistor 460. On the other hand, a second electrode layer 445 functioning as the common electrode layer of a liquid crystal element is supplied with a fixed potential (e.g., a ground potential) serving as a reference with respect to the potential of the image signal supplied to the pixel electrode layer. A common potential is preferably set to a potential around an intermediate potential of the image signal which is transmitted as data in such a level as not to generate flickers. The second electrode layer 445 functioning as the common electrode layer can operate in a floating state (an electrically isolated state).

The transistor 460 is an inverted-staggered thin film transistor which includes, over a first substrate 441 having an insulating surface, the gate electrode layer 401, a gate insulating layer 402, the semiconductor layer 403, the source electrode layer 405a, and the drain electrode layer 405b.

An insulating film 407 which covers the transistor 460 and is in contact with the semiconductor layer 403, and an insulating film 409 are provided. An insulating layer 413 is stacked over the insulating film 409. The insulating film 407, the insulating film 409, and the insulating layer 413 function as interlayer films provided between the transistor 460 and the first electrode layer 447 and between the transistor 460 and the second electrode layer 445.

As illustrated in FIGS. 1A and 1B, the first electrode layer 447 and the second electrode layer 445 are alternately provided without overlapping with each other.

The first electrode layer 447 and the second electrode layer 445 do not have flat plate-like shapes but have various opening patterns including a bent portion or a branching comb-like shape.

The drain electrode layer 405b electrically connected to the first electrode layer 447 is provided below the first electrode layer 447 with the insulating layer 413, the insulating film 409, and the insulating film 407 sandwiched therebetween, and is extended over the gate insulating layer 402. A conductive layer 406 formed through the same steps as the drain electrode layer 405b is provided below the second electrode layer 445 with the insulating layer 413, the insulating film 409, and the insulating film 407 sandwiched therebetween, and is extended over the gate insulating layer 402.

The drain electrode layer 405b and the conductive layer 406 reflect the shapes of the first electrode layer 447 and the second electrode layer 445 formed thereover respectively, and each have an opening pattern including a bent portion or a branching comb-like shape.

The gate insulating layer 402, the insulating film 407, the insulating film 409, and the insulating layer 413 which are provided between the first electrode layer 447 and the second electrode layer 445 are selectively removed, and openings 431 are formed. In this embodiment, an example is described in which the openings 431 reach the first substrate 441. A liquid crystal layer 444 is formed so as to fill the openings 431.

The liquid crystal layer 444 is provided over the first electrode layer 447 and the second electrode layer 445 and sealed with the second substrate 442 which is a counter substrate.

The first substrate 441 and the second substrate 442 are light-transmitting substrates and are provided with a polarizing plate 443a and a polarizing plate 443b on their outer sides (on the sides opposite to the liquid crystal layer 444), respectively.

The first electrode layer 447 and the drain electrode layer 405b are electrically connected to each other, and can be supplied with the same potential. The second electrode layer 445 and the conductive layer 406 are also electrically connected to each other, and can be supplied with the same potential. As long as being supplied with the same potential, the first electrode layer 447 and the drain electrode layer 405b, or the second electrode layer 445 and the conductive layer 406 are not necessarily provided in direct contact with each other, and may be supplied with the same potential through another wiring layer (i.e., a potential supplied to another wiring layer).

Therefore, when a voltage is applied between the first electrode layer 447 and the second electrode layer 445, the same voltage can also be applied between the drain electrode layer 405b and the conductive layer 406. Thus, in the liquid crystal layer 444, an electric field can be widely formed between the first electrode layer 447 and the second electrode layer 445 and also in regions of the openings 431 between the drain electrode layer 405b and the conductive layer 406.

The maximum thickness (film thickness) of the liquid crystal layer 444 is preferably greater than or equal to 1 μm and less than or equal to 20 μm. Note that in this specification, the maximum thickness (film thickness) of the liquid crystal layer is also referred to as a cell gap.

The shortest distance between the first electrode layer 447 and the second electrode layer 445 which are adjacent to each other with the liquid crystal layer 444 sandwiched therebetween is greater than or equal to 0.5 μm and less than or equal to 30 μm, preferably greater than or equal to 1 μm and less than or equal to 10 μm.

Figure 11A:
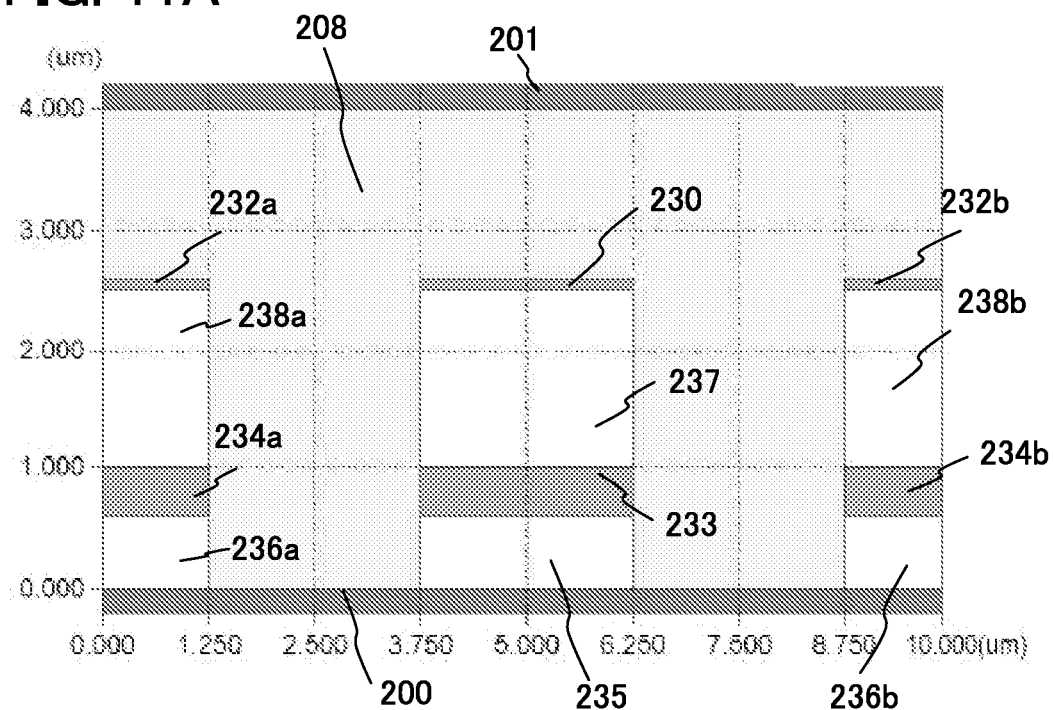
FIGS. 11A and 11B show calculation results of an electric field mode of a liquid crystal display device.
Figure 11B:
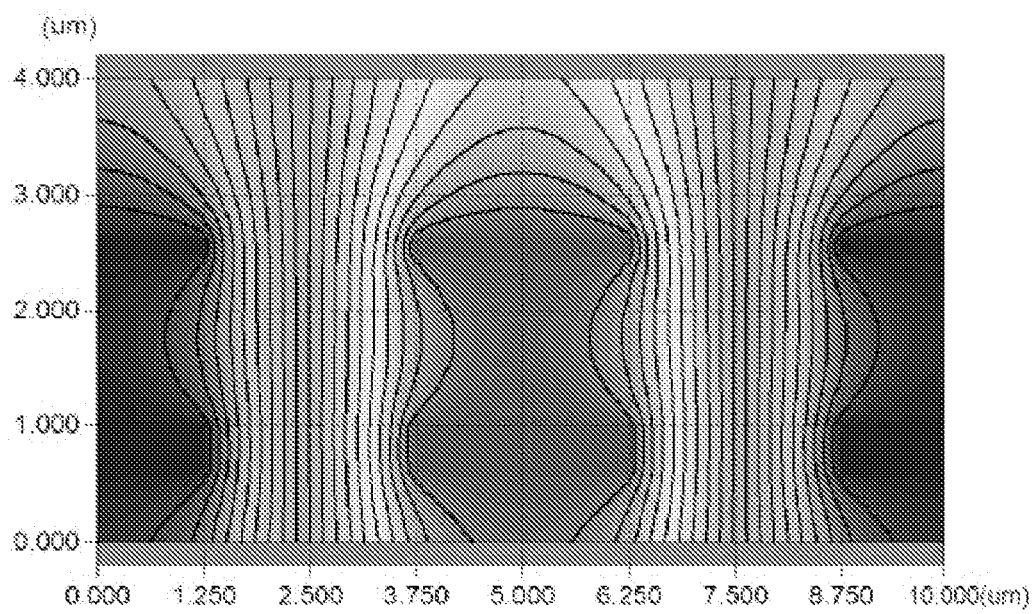

FIG. 11B shows calculation results of an electric field applied in a liquid crystal display device. The calculation was performed using LCD Master, 2s Bench manufactured by SHINTECH, Inc.

FIG. 11A shows the structure of the liquid crystal display device used for calculation. FIG. 11A shows the liquid crystal display device in which a first substrate 200 and a second substrate 201 are positioned so as to face each other and a liquid crystal layer 208 that includes a liquid crystal material exhibiting a blue phase is sandwiched between these substrates. The first substrate 441 in FIG. 1B corresponds to the first substrate 200 in FIG. 11A; the second substrate 442 in FIG. 1B corresponds to the second substrate 201 in FIG. 11A; the first electrode layer 447 in FIGS. 1A and 1B corresponds to the pixel electrode layer 230 in FIG. 11A; the liquid crystal layer 444 in FIG. 1B corresponds to the liquid crystal layer 208 in FIG. 11A; the drain electrode layer 405b in FIGS. 1A and 1B corresponds to a conductive layer 233 in FIG. 11A; the second electrode layer 445 in FIGS. 1A and 1B corresponds to common electrode layers 232a and 232b in FIG. 11A; the conductive layer 406 in FIG. 1B corresponds to conductive layers 234a and 234b in FIG. 11A; the gate insulating layer 402 in FIG. 1B corresponds to interlayer films 235, 236a, and 236b in FIG. 11A; and the insulating film 407, the insulating film 409, and the insulating layer 413 in FIG. 1B correspond to interlayer films 237, 238a, and 238b in FIG. 11A.

Insulators with a dielectric constant of 4 are used for the interlayer films 235, 236a, 236b, 237, 238a, and 238b, and the cross-sectional widths thereof are each set to 2.5 μm. The thicknesses (heights) of the interlayer films 235, 236a, and 236b are each 0.6 μm, and the thicknesses (heights) of the interlayer films 237, 238a, and 238b are each 1.5 μm.

The pixel electrode layer 230 is formed over a stack of the interlayer film 235, the conductive layer 233, and the interlayer film 237; the common electrode layer 232a is formed over a stack of the interlayer film 236a, the conductive layer 234a, and the interlayer film 238a; and the common electrode layer 232b is formed over a stack of the interlayer film 236b, the conductive layer 234b, and the interlayer film 238b. Note that the pixel electrode layer 230 and the conductive layer 233 are electrically connected to each other; and the common electrode layers 232a and 232b and the conductive layers 234a and 234b are electrically connected to each other. Openings reaching the first substrate 200 are formed between the pixel electrode layer 230 and the common electrode layer 232a and between the pixel electrode layer 230 and the common electrode layer 232b, and the liquid crystal layer 208 is also formed in the openings.

The thicknesses of the pixel electrode layer 230, the common electrode layer 232a, and the common electrode layer 232b are each 0.1 μm; the thicknesses of the conductive layers 233, 234a, and 234b are each 0.4 μm; and the distance between the pixel electrode layer 230 and the common electrode layer 232a and the distance between the pixel electrode layer 230 and the common electrode layer 232b are each 2.5 μm. The distance between the first substrate 200 and the second substrate 201, which corresponds to a cell gap (the maximum thickness of the liquid crystal layer), is 4 μm.

FIG. 11B shows results of calculation performed on the structure of FIG. 11A under the condition where potentials supplied to the common electrode layers 232a and 232b and the conductive layers 234a and 234b are each set to 0 V and where potentials supplied to the pixel electrode layer 230 and the conductive layer 233 are each set to 10 V.

In FIG. 11B, a solid line represents an equipotential line, and the pixel electrode layer, the common electrode layer, or the conductive layer is positioned in the center of a circular pattern of the equipotential lines.

An electric field is applied perpendicularly to the equipotential line; thus, as shown in FIG. 11B, it can be confirmed that a horizontal electric field is applied between the conductive layer 233 and the pixel electrode layer 230 which are stacked with the interlayer film 237 sandwiched therebetween, between the conductive layer 234a and the common electrode layer 232a which are stacked with the interlayer film 238a sandwiched therebetween, and between the conductive layer 234b and the common electrode layer 232b which are stacked with the interlayer film 238b sandwiched therebetween.

An electric field is formed also between the pixel electrode layer 230 and the common electrode layers 232a and 232b and between the conductive layer 233 and the conductive layers 234a and 234b; thus, an electric field can be entirely formed in the liquid crystal layer 208 which is included in the opening regions provided in the interlayer films on the first substrate 200 side. In such a manner, stacked bodies each including the conductive layer and the electrode layer which have the same potential are formed, whereby an electric field can be widely formed in the liquid crystal layer. Accordingly, liquid crystal molecules can be controlled with the use of the electric field.

Therefore, an electric field can be widely formed in the liquid crystal layer 208 in the liquid crystal display device, and liquid crystal molecules can be made to respond in the entire liquid crystal layer 208 including a film thickness direction. Thus, white transmittance can be improved. In addition, the contrast ratio, which is a ratio of white transmittance to black transmittance (light transmittance in black display), can be increased. Further, an electric field can be effectively applied even to a liquid crystal material (liquid crystal mixture) exhibiting a blue phase, which has high viscosity; therefore, a reduction in power consumption can also be achieved.

Manufacturing steps of the liquid crystal display device illustrated in FIGS. 1A and 1B are described with reference to FIGS. 2A to 2E. FIGS. 2A to 2E are cross-sectional views illustrating the manufacturing steps of the liquid crystal display device.

Figure 2A:
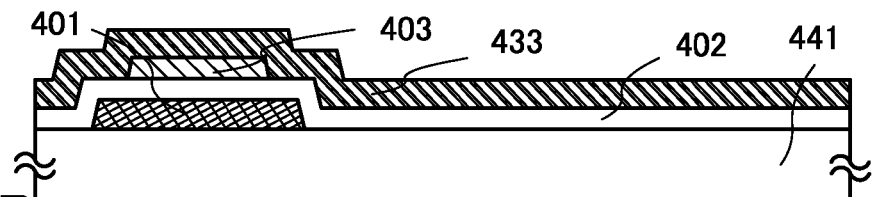
FIGS. 2A to 2E illustrate a method for manufacturing a liquid crystal display device.

In FIG. 2A, the gate electrode layer 401, the gate insulating layer 402, and the semiconductor layer 403 are formed over the first substrate 441 which is an element substrate, and a conductive film 433 is formed over the gate electrode layer 401, the gate insulating layer 402, and the semiconductor layer 403.

An insulating film serving as a base film may be provided between the first substrate 441 and the gate electrode layer 401. The base film has a function of preventing diffusion of an impurity element from the first substrate 441, and can be formed to have a single-layer structure or a stacked structure using one or more of a silicon nitride film, a silicon oxide film, a silicon nitride oxide film, and a silicon oxynitride film.

The gate electrode layer 401 can be formed to have a single-layer or stacked structure using a metal material such as molybdenum, titanium, chromium, tantalum, tungsten, aluminum, copper, neodymium, or scandium, or an alloy material which contains any of these materials as its main component. The use of a light-shielding conductive film for the gate electrode layer 401 can prevent light from a backlight (light emitted through the first substrate 441) from entering the semiconductor layer 403.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable.

The gate insulating layer 402 can be formed to have a single-layer structure or a stacked structure using a silicon oxide layer, a silicon nitride layer, a silicon oxynitride layer, or a silicon nitride oxide layer by a plasma CVD method, a sputtering method, or the like. Alternatively, the gate insulating layer 402 can be formed using a silicon oxide layer by a CVD method using an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

As a material of the conductive film 433, an element selected from Al, Cr, Ta, Ti, Mo, or W; an alloy containing any of these elements as a component; an alloy film containing any of these elements in combination; and the like can be given. In the case where heat treatment is performed, the conductive film preferably has heat resistance enough to withstand this heat treatment. For example, since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), or scandium (Sc); an alloy containing any of these elements as a component; an alloy containing these elements in combination; and a nitride containing any of these elements as a component.

Alternatively, the conductive film 433 may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials including silicon oxide can be used.

The gate insulating layer 402, the semiconductor layer 403, and the conductive film 433 may be successively formed without exposure to air. By successive formation without exposure to air, each interface between the stacked layers can be formed without being contaminated by atmospheric components or contaminant impurity elements in air; thus, variation in characteristics of the transistors can be reduced.

Figure 2B:
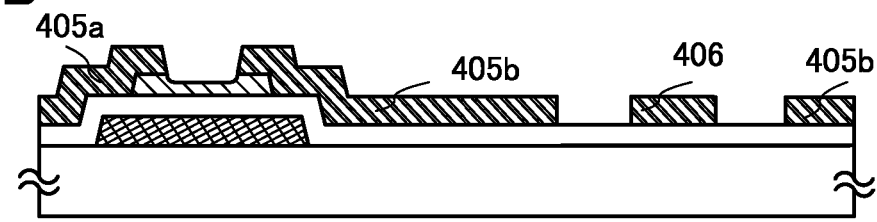

The conductive film 433 is processed through a photolithography step, so that the source electrode layer 405a, the drain electrode layer 405b, and the conductive layer 406 are formed (see FIG. 2B). Note that in this embodiment, an example is described in which part of the semiconductor layer 403, over which neither the source electrode layer 405a nor the drain electrode layer 405b is formed, is etched in the etching step of the conductive film 433 so that the semiconductor layer 403 has a groove (a depressed portion).

Figure 2C:
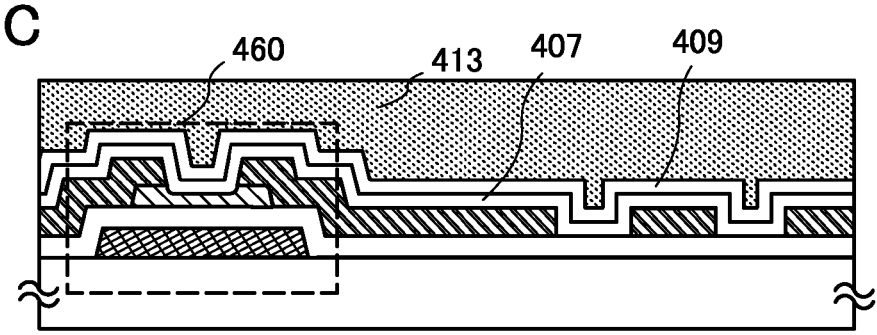
Figure 2D:
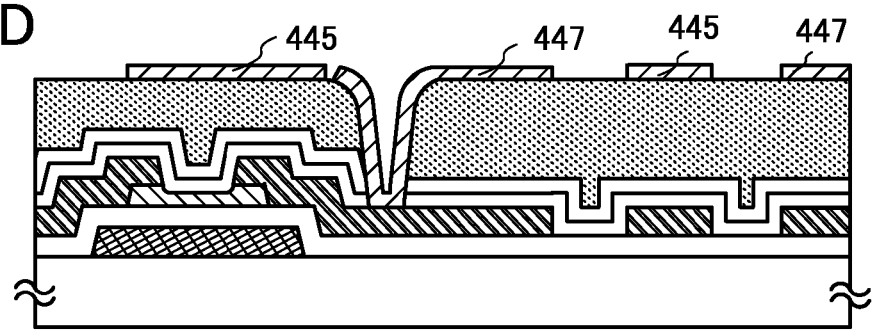

The insulating film 407, the insulating film 409, and the insulating layer 413 are stacked over the transistor 460 and the conductive layer 406 (see FIG. 2C).

An inorganic insulating film or an organic insulating film formed by a dry method or a wet method can be used for the insulating film 407, the insulating film 409, and the insulating layer 413 which cover the transistor 460. For example, the insulating film 407, the insulating film 409, and the insulating layer 413 may be formed using silicon nitride, silicon oxide, silicon nitride oxide, silicon oxynitride, aluminum nitride, aluminum oxide, aluminum nitride oxide, aluminum oxynitride, or the like by a dry method such as a CVD method or a sputtering method. Alternatively, they may be formed using an organic material such as polyimide, acrylic, benzocyclobutene, polyamide, or epoxy by a wet method such as spin coating, dipping, spray coating, a droplet discharge method (e.g., an inkjet method, screen printing, or offset printing) or with a tool such as a roll coater, a curtain coater, or a knife coater. As an alternative to such organic materials, it is possible to use a low-dielectric constant material (a low-k material), a siloxane-based resin, phosphosilicate glass (PSG), borophosphosilicate glass (BPSG), or the like.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group. A siloxane-based resin is applied by a coating method and baked; thus, the insulating layer 413 can be formed.

Alternatively, the insulating film 407 and the insulating film 409 may be formed by stacking a plurality of insulating films formed using any of these materials. For example, the insulating film 407 and the insulating film 409 may have a structure in which an organic resin film is stacked over an inorganic insulating film.

An opening (a contact hole) reaching the drain electrode layer 405b is formed in the insulating film 407, the insulating film 409, and the insulating layer 413, and a conductive film is formed in the opening and over the insulating layer 413. The conductive film is processed through a photolithography step, so that the first electrode layer 447 electrically connected to the drain electrode layer 405b and the second electrode layer 445 electrically connected to the conductive layer 406 are formed (see FIG. 2D). Although an electrical connection between the second electrode layer 445 and the conductive layer 406 is not illustrated in the drawing, the electrical connection therebetween may be obtained in such a manner that an opening reaching the conductive layer 406 is formed and then the second electrode layer 445 is formed in the opening in the same manner as the connection between the first electrode layer 447 and the drain electrode layer 405b. Alternatively, a wiring layer supplied with the same potential as the second electrode layer 445 may be connected to the conductive layer 406 so that the conductive layer 406 can be supplied with the same potential as the second electrode layer 445.

In a display region of the pixel, the first electrode layer 447 and the drain electrode layer 405b preferably have substantially the same shape and overlap with each other, and the second electrode layer 445 and the conductive layer 406 preferably have substantially the same shape and overlap with each other.

It is preferable that the first electrode layer 447 and the second electrode layer 445 each have a light-transmitting property; however, since an opening pattern is provided, a non-light-transmitting material such as a metal film may be used depending on their shapes.

The first electrode layer 447 and the second electrode layer 445 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 447 and the second electrode layer 445 can be formed using one or more of the following: metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

The first electrode layer 447 and the second electrode layer 445 can be formed using a conductive composition including a conductive macromolecule (also referred to as a conductive polymer). The first electrode layer 447 and the second electrode layer 445 formed using such a conductive composition preferably have a sheet resistance of 10000 Ω/square or less and a light transmittance of 70% or higher at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Figure 2E:
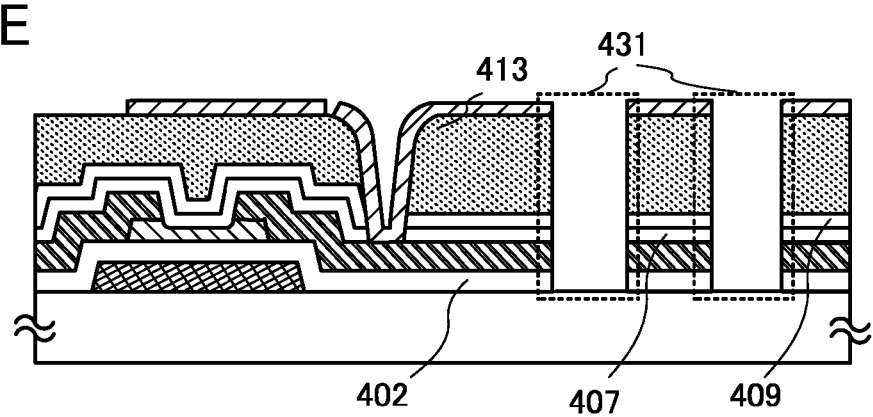

Next, the insulating film 407, the insulating film 409, and the insulating layer 413 provided between the first electrode layer 447 and the second electrode layer 445 are selectively removed, so that the openings 431 reaching the first substrate 441 are formed (see FIG. 2E).

FIGS. 1A and 1B and FIGS. 2A to 2E show an example in which the layers including the gate insulating layer 402 are removed and the openings 431 reaching the first substrate 441 are formed; however, the gate insulating layer 402 may remain in the openings 431. Further, FIGS. 1A and 1B and FIGS. 2A to 2E show an example in which end portions of the drain electrode layer 405b and the conductive layer 406 are exposed in the openings 431 and aligned with end portions of the first electrode layer 447 and the second electrode layer 445, respectively; however, the end portions of the drain electrode layer 405b and the conductive layer 406 may be covered with the insulating film 407 formed thereover.

Figure 4A:
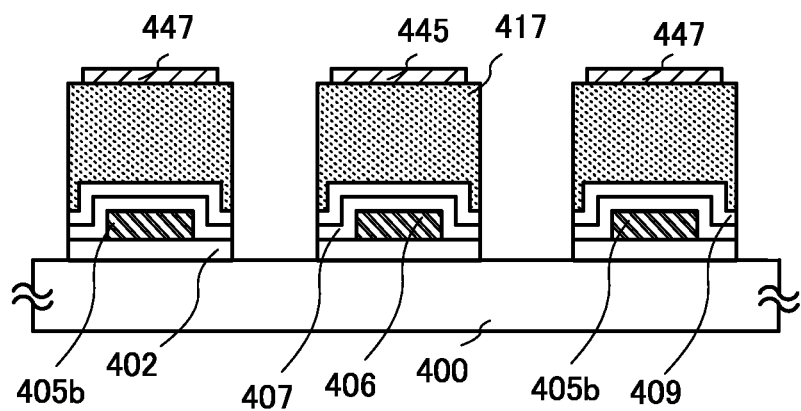
FIGS. 4A and 4B each illustrate a liquid crystal display device.
Figure 4B:
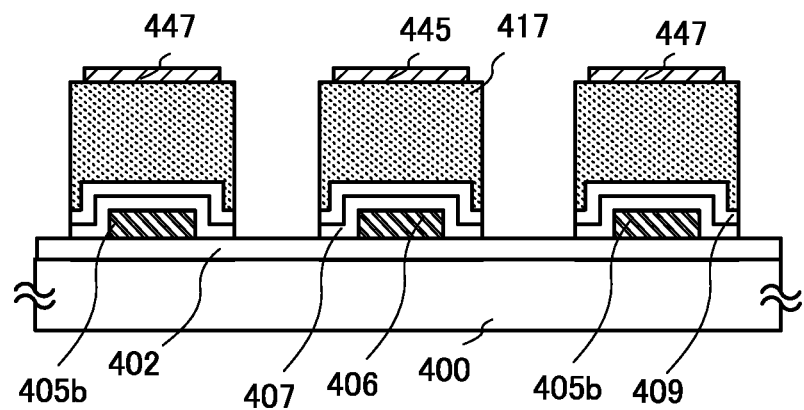

FIGS. 4A and 4B each show an example of forming openings between the first electrode layer 447 which is the pixel electrode layer and the second electrode layer 445 which is the common electrode layer.

In FIG. 4A, the end portions of the drain electrode layer 405b and the conductive layer 406 are not exposed in the openings and covered with the insulating film 407. In this example, the end portions of the first electrode layer 447 and the second electrode layer 445 are not aligned with side surfaces of the openings. FIG. 4B shows an example in which the gate insulating layer 402 is not removed and remains in the openings.

In this manner, the openings formed by removing the interlayer films between the pixel electrode layer and the common electrode layer may be formed so as to reach at least a region between the drain electrode layer 405b and the conductive layer 406. Liquid crystal molecules with which the openings between the drain electrode layer 405b and the conductive layer 406 are filled can be controlled by an electric field formed by the drain electrode layer 405b and the conductive layer 406.

In the process of forming the semiconductor layer, the electrode layer, the conductive layer, and the like and in the process of forming the openings, an etching step is performed with the use of a resist mask which is formed through a photolithography step in order to process a thin film into a desired shape. A plurality of masks may be used or a plurality of etching steps may be performed depending on a material or a shape to be processed.

In order to reduce the number of resist masks, a resist mask used in a first etching step can be processed by ashing to be used in a second etching step.

Further, with the use of a resist mask having a plurality of regions with different thicknesses (typically, two kinds of thicknesses), which is formed using a multi-tone mask, the number of resist masks can be reduced, resulting in a simplified process and lower cost.

Dry etching or wet etching can be used for the etching step.

As an etching apparatus used for the dry etching, an etching apparatus using a reactive ion etching method (an RIE method), or a dry etching apparatus using a high-density plasma source such as electron cyclotron resonance (ECR) or inductively coupled plasma (ICP) can be used. As a dry etching apparatus by which uniform electric discharge can be obtained over a wide area as compared with an ICP etching apparatus, there is an ECCP (enhanced capacitively coupled plasma) mode apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be employed even when a substrate having a size exceeding 3 meters of the tenth generation is used as the substrate, for example.

The etching conditions are adjusted as appropriate depending on a material so that a film can be etched into a desired shape. For example, in dry etching, etching conditions such as the amount of electric power applied to a coil-shaped electrode, the amount of electric power applied to an electrode on a substrate side, and the temperature of the electrode on the substrate side are adjusted as appropriate. In wet etching, etching conditions such as the etchant, the etching time, and the temperature are adjusted as appropriate. Since the wet etching proceeds in both a film thickness direction and a film width direction, the size and the shape of a resist mask are determined in consideration of a region in the film width direction (the length of the region) which is removed by the etching step.

For example, the openings 431 are formed by selectively removing the gate insulating layer 402, the insulating film 407, the insulating film 409, and the insulating layer 413, and each of the wall surfaces of the openings 431 is on a straight line in FIG. 1B; however, in some cases, the wall surfaces of the openings 431 become uneven due to different film widths depending on materials to be used and an etching method.

For example, an example is described in which a stack of a silicon oxynitride film formed as a gate insulating layer (film thickness: 600 nm) and an acrylic resin film formed as an insulating layer (film thickness: 2 μm) is selectively removed so that an opening is formed. Note that a conductive layer formed of a stack of a titanium film (film thickness: 50 nm), an aluminum film (film thickness: 200 nm), and a titanium film (film thickness: 50 nm) is formed between the gate insulating layer and the insulating layer.

The silicon oxynitride film which is the gate insulating layer is etched by an ICP dry etching method so that the opening is formed. The etching conditions are as follows: $CHF_3$ and He are used; the amount of electric power applied to a coil-shaped electrode is 475 W; the amount of electric power applied to an electrode on a substrate side is 300 W; the pressure is 5.5 Pa; the temperature of the lower electrode is 70° C.; and the etching time is 160 seconds.

Next, the acrylic resin film as the insulating layer is formed over the gate insulating layer and the conductive layer by a coating method, and an indium tin oxide film serving as the pixel electrode layer and the common electrode layer is stacked over the insulating layer by a sputtering method.

The indium tin oxide film is etched by a wet etching method so that the pixel electrode layer and the common electrode layer are formed. As an etchant, ITO-07N (produced by KANTO CHEMICAL CO., INC.) can be used.

Then, the acrylic resin film which is the insulating layer is etched by an RIE method so that the opening is formed. The etching conditions are as follows: $CF_4$, He, and $O_2$ are used; the amount of electric power is 500 W; the pressure is 500 mTorr; and the etching time is 150 seconds. Through the above steps, the opening can be formed in the silicon oxynitride film which is the gate insulating layer and the acrylic resin film which is the insulating layer.

The opening may be formed by simultaneously etching the silicon oxynitride film which is the gate insulating layer and the acrylic resin film which is the insulating layer. By selecting the etching conditions under which the indium tin oxide film serving as the pixel electrode layer and the common electrode layer is not easily etched, the silicon oxynitride film which is the gate insulating layer and the acrylic resin film which is the insulating layer can be etched with the use of the indium tin oxide film as a mask. Needless to say, a mask may be additionally formed over the indium tin oxide film.

In the case where the openings 431 are formed in the drain electrode layer 405b and the conductive layer 406, etching conditions should be set such that the drain electrode layer 405b and the conductive layer 406 are not easily etched when the gate insulating layer 402, the insulating film 407, the insulating film 409, and the insulating layer 413 are etched.

The first substrate 441 and the second substrate 442 which is the counter substrate are firmly attached to each other by a sealant with the liquid crystal layer sandwiched therebetween. The liquid crystal layer can be formed by a dispenser method (a dropping method), or an injection method by which liquid crystal is injected using a capillary phenomenon or the like after the first substrate 441 and the second substrate 442 are attached to each other.

A liquid crystal material exhibiting a blue phase is used for the liquid crystal layer 444.

The liquid crystal material exhibiting a blue phase includes liquid crystal and a chiral agent. The chiral agent is employed to align the liquid crystal in a helical structure and to make the liquid crystal exhibit a blue phase. For example, a liquid crystal material into which a chiral agent is mixed at several weight percent or more may be used for the liquid crystal layer.

As the liquid crystal, thermotropic liquid crystal, low-molecular liquid crystal, high-molecular liquid crystal, ferroelectric liquid crystal, anti-ferroelectric liquid crystal, or the like is used.

As the chiral agent, a material having a high compatibility with liquid crystal and a strong twisting power is used. Either an R-enantiomer or an S-enantiomer is used, and a racemic mixture in which an R-enantiomer and an S-enantiomer are mixed at 50:50 is not used.

The above liquid crystal material exhibits a cholesteric phase, a cholesteric blue phase, a smectic phase, a smectic blue phase, a cubic phase, a chiral nematic phase, an isotropic phase, or the like depending on conditions.

A cholesteric blue phase and a smectic blue phase, which are blue phases, are observed in a liquid crystal material having a cholesteric phase or a smectic phase with a relatively short helical pitch of 500 nm or less. The alignment of the liquid crystal material has a double twist structure. Having the order of less than or equal to a wavelength of visible light, the liquid crystal material is transparent, and optical modulation action is generated through a change in alignment order by voltage application. A blue phase is optically isotropic and thus has no viewing angle dependence. Thus, an alignment film is not necessarily formed; therefore, display image quality can be improved and cost can be reduced.

The blue phase is exhibited only within a narrow temperature range; therefore, it is preferable that a photocurable resin and a photopolymerization initiator be added to a liquid crystal material and polymer stabilization treatment be performed in order to widen the temperature range. The polymer stabilization treatment is performed in such a manner that a liquid crystal material including liquid crystal, a chiral agent, a photocurable resin, and a photopolymerization initiator is irradiated with light having a wavelength with which the photocurable resin and the photopolymerization initiator are reacted. This polymer stabilization treatment may be performed by irradiating a liquid crystal material in the state of exhibiting an isotropic phase with light or by irradiating a liquid crystal material in the state of exhibiting a blue phase with light under the control of the temperature.

For example, the polymer stabilization treatment is performed in such a manner that the temperature of a liquid crystal layer is controlled and the liquid crystal layer is irradiated with light with a blue phase exhibited. Note that the polymer stabilization treatment is not limited to this manner and may be performed in such a manner that a liquid crystal layer is irradiated with light with an isotropic phase exhibited at a temperature within +10° C., preferably +5° C. from the phase transition temperature between the blue phase and the isotropic phase. The phase transition temperature between the blue phase and the isotropic phase is a temperature at which the phase changes from the blue phase to the isotropic phase when the temperature increases, or a temperature at which the phase changes from the isotropic phase to the blue phase when the temperature decreases. As an example of the polymer stabilization treatment, the following method can be employed: after heating a liquid crystal layer to exhibit the isotropic phase, the temperature of the liquid crystal layer is gradually decreased so that the phase changes to the blue phase, and then, irradiation with light is performed while the temperature at which the blue phase is exhibited is kept. Alternatively, after the phase changes to the isotropic phase by gradually heating a liquid crystal layer, the liquid crystal layer can be irradiated with light at a temperature within +10° C., preferably +5° C. of the phase transition temperature between the blue phase and the isotropic phase (with an isotropic phase exhibited). In the case of using an ultraviolet curable resin (a UV curable resin) as the photocurable resin included in the liquid crystal material, the liquid crystal layer may be irradiated with ultraviolet rays. Even in the case where the blue phase is not exhibited, if polymer stabilization treatment is performed by irradiation with light at a temperature within +10° C., preferably +5° C. from the phase transition temperature between the blue phase and the isotropic phase (with an isotropic phase exhibited), the response time can be made as short as 1 msec or less and high-speed response is possible.

The photocurable resin may be a monofunctional monomer such as acrylate or methacrylate; a polyfunctional monomer such as diacrylate, triacrylate, dimethacrylate, or trimethacrylate; or a mixture thereof. Further, the photocurable resin may have liquid crystallinity, non-liquid crystallinity, or both of them. A resin which is cured with light having a wavelength with which the photopolymerization initiator to be used is reacted may be selected as the photocurable resin, and an ultraviolet curable resin can be typically used.

As the photopolymerization initiator, a radical polymerization initiator which generates radicals by light irradiation, an acid generator which generates an acid by light irradiation, or a base generator which generates a base by light irradiation may be used.

Specifically, a mixture of JC-1041XX (produced by Chisso Corporation) and 4-cyano-4'-pentylbiphenyl can be used as the liquid crystal material. ZLI-4572 (produced by Merck Ltd., Japan) can be used as the chiral agent. As the photocurable resin, 2-ethylhexyl acrylate, RM257 (produced by Merck Ltd., Japan), or trimethylolpropane triacrylate can be used. As the photopolymerization initiator, 2,2-dimethoxy-2-phenylacetophenone can be used.

In the case where, in this specification, the liquid crystal display device is a transmissive liquid crystal display device in which display is performed by transmission of light from a light source (or a semi-transmissive liquid crystal display device), it is necessary to transmit light at least in a pixel region. Therefore, the first substrate, the second substrate, and thin films such as an insulating film and a conductive film which are present in the pixel region through which light is transmitted all have a light-transmitting property with respect to light in a visible wavelength range.

As the sealant, it is typically preferable to use a visible light curable resin, an ultraviolet curable resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

Polymer stabilization treatment is performed on the liquid crystal layer by irradiation with light, so that the liquid crystal layer 444 is formed. The light has a wavelength with which the photocurable resin and the photopolymerization initiator included in the liquid crystal layer are reacted. By this polymer stabilization treatment with light irradiation, the temperature range in which the liquid crystal layer 444 exhibits a blue phase can be widened.

In the case where a photocurable resin such as an ultraviolet curable resin is used as a sealant and a liquid crystal layer is formed by a dropping method, for example, the sealant may be cured by the light irradiation step of the polymer stabilization treatment.

When a light-blocking layer is provided so as to cover at least the semiconductor layer, incident light on the semiconductor layer of the transistor can be blocked; accordingly, electric characteristics of the transistor can be prevented from being varied due to photosensitivity of the semiconductor and can be further stabilized. Further, when the light-blocking layer is provided in the contact hole or provided so as to cover a space between the pixels, display unevenness caused by light leakage or the like due to an alignment defect of liquid crystal that occurs easily on the contact hole can be made invisible; therefore, a reduction in contrast can be suppressed. Thus, high definition and high reliability of the liquid crystal display device can be achieved.

The light-blocking layer is formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, aluminum, or the like, for example.

There is no particular limitation on the formation method of the light-blocking layer, and a dry method such as vapor deposition, sputtering, CVD, or the like or a wet method such as spin coating, dip coating, spray coating, droplet discharging (e.g., ink jetting, screen printing, or offset printing), or the like may be used depending on the material. If needed, an etching method (dry etching or wet etching) may be employed to form a desired pattern.

In the case of employing a structure in which the light-blocking layer is formed on the first substrate 441 side which is the element substrate side, light delivered from the counter substrate (the second substrate 442) side is not absorbed or blocked by the light-blocking layer in light irradiation step for polymer stabilization; accordingly, the entire liquid crystal layer can be uniformly irradiated with light, and the liquid crystal layer can be photopolymerized. Thus, alignment disorder of liquid crystal due to nonuniform photopolymerization, display unevenness due to the alignment disorder, and the like can be prevented.

In this embodiment, the polarizing plate 443a is provided on the outer side (on the side opposite to the liquid crystal layer 444) of the first substrate 441, and the polarizing plate 443b is provided on the outer side (on the side opposite to the liquid crystal layer 444) of the second substrate 442. In addition to the polarizing plate, an optical film such as a retardation plate or an anti-reflection film may be provided. For example, circular polarization may be employed using a polarizing plate and a retardation plate. Through the above process, the liquid crystal display device can be completed.

In the case of manufacturing a plurality of liquid crystal display devices with the use of a large-sized substrate (a so-called multiple panel method), a division step can be performed before the polymer stabilization treatment is performed or before the polarizing plates are provided. In consideration of the influence of the division step on the liquid crystal layer (such as alignment disorder due to force applied in the division step), it is preferable that the division step be performed after the first substrate is attached to the second substrate and before the polymer stabilization treatment is performed.

Although not illustrated, a backlight, a sidelight, or the like may be used as a light source. Light from the light source is emitted from the side of the first substrate 441, which is an element substrate, so as to pass through the second substrate 442 on the viewing side.

The liquid crystal material exhibiting a blue phase has a short response time of 1 msec or less and enables high-speed response, whereby the liquid crystal display device can show high performance.

For example, a liquid crystal material exhibiting a blue phase, which is capable of high-speed response, can be favorably used for a successive additive color mixing method (a field sequential method) in which light-emitting diodes (LEDs) of RGB or the like are arranged in a backlight unit and color display is performed by time division, or a three-dimensional display method using a shutter glasses system in which images on the right side and images on the left side are alternately viewed by time division.

In the above manner, the contrast ratio of the liquid crystal display device including a liquid crystal layer exhibiting a blue phase can be increased.

In addition, since high white transmittance can be obtained with lower voltage, a reduction in power consumption of the liquid crystal display device can also be achieved.

Embodiment 2

A liquid crystal display device which is another embodiment of a structure of the invention disclosed in this specification will be described with reference to FIGS. 3A and 3B and FIGS. 12A and 12B. FIG. 3B is a cross-sectional view of a liquid crystal display device in which a common electrode layer is further provided on the counter substrate (the second substrate) side in the liquid crystal display device described in Embodiment 1. Note that components in common with those in Embodiment 1 can be formed using a similar material and a similar manufacturing method, and detailed description of the same portions and portions having similar functions will be omitted.

Figure 3A:
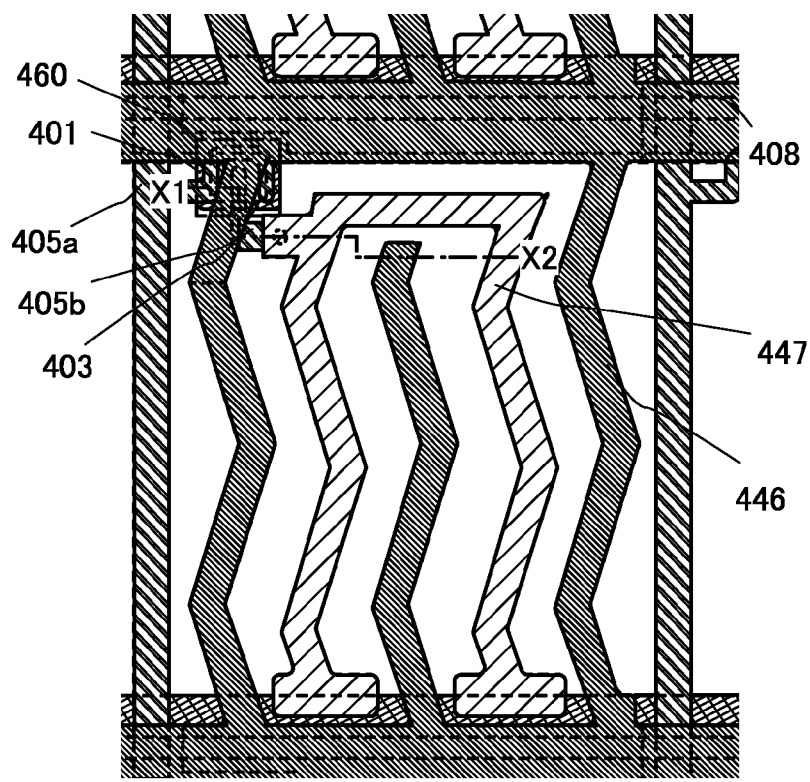
FIGS. 3A and 3B illustrate a liquid crystal display device.
Figure 3B:
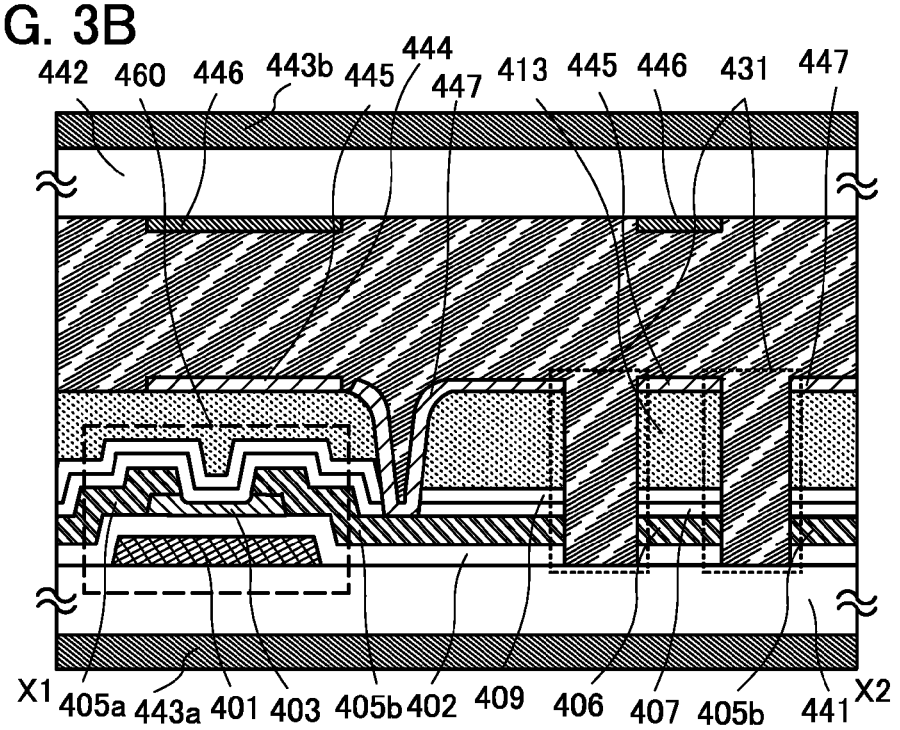

FIG. 3A is a plan view of a liquid crystal display device, and FIG. 3B is a cross-sectional view taken along line X1-X2 in FIG. 3A. Note that in the plan view of FIG. 3A, part of components on the first substrate 441 side and the third electrode layer 446 on the second substrate side are illustrated, and other components are omitted.

Another common electrode layer may be provided on the counter substrate (the second substrate) side so that a pair of common electrode layers face each other. As illustrated in FIGS. 3A and 3B, the second electrode layer 445 which is the common electrode layer on the first substrate 441 side (also referred to as a first common electrode layer) and the third electrode layer 446 which is the common electrode layer on the second substrate 442 side (also referred to as a second common electrode layer) are positioned so as to overlap with each other with the liquid crystal layer 444 sandwiched therebetween. As in this embodiment, in the case where two common electrode layers, the first common electrode layer and the second common electrode layer, are provided, the first common electrode layer (the second electrode layer 445) and the second common electrode layer (the third electrode layer 446) preferably have the same potential.

The first electrode layer 447, the second electrode layer 445, and the third electrode layer 446 do not have flat plate-like shapes but have various opening patterns including a bent portion or a branching comb-like shape. In the case of forming the third electrode layer 446, the second electrode layer 445 and the third electrode layer 446 have substantially the same pattern at least in a pixel region in a plan view and are positioned so as to overlap with each other with the liquid crystal layer sandwiched therebetween. Although the cross-sectional view of FIG. 3B illustrates an example in which end portions of the second electrode layer 445 and the third electrode layer 446 are aligned with each other, the end portions are not necessarily aligned with each other as long as at least parts of the second electrode layer 445 and the third electrode layer 446 overlap with each other (for example, the end portion of the second electrode layer 445 may be positioned at an outer or inner side of the end portion of the third electrode layer 446).

The drain electrode layer 405b of the transistor 460 is electrically connected to the first electrode layer 447, and is provided below the first electrode layer 447 with the insulating layer 413, the insulating film 409, and the insulating film 407 sandwiched therebetween, and is extended over the gate insulating layer 402. The conductive layer 406 formed through the same steps as the drain electrode layer 405b is provided below the second electrode layer 445 with the insulating layer 413, the insulating film 409, and the insulating film 407 sandwiched therebetween, and is extended over the gate insulating layer 402.

The gate insulating layer 402, the insulating film 407, the insulating film 409, and the insulating layer 413 which are provided between the first electrode layer 447 and the second electrode layer 445 are selectively removed, and the openings 431 are formed. In this embodiment, an example is described in which the openings 431 reach the first substrate 441. The liquid crystal layer 444 is formed so as to fill the openings 431.

The liquid crystal layer 444 is provided over the first electrode layer 447 and the second electrode layer 445 and sealed with the second substrate 442 which is the counter substrate.

The first substrate 441 and the second substrate 442 are light-transmitting substrates and are provided with the polarizing plate 443a and the polarizing plate 443b on their outer sides (on the sides opposite to the liquid crystal layer 444), respectively.

The first electrode layer 447 and the drain electrode layer 405b are electrically connected to each other, and can be supplied with the same potential. The second electrode layer 445 and the conductive layer 406 are also electrically connected to each other, and can be supplied with the same potential. As long as being supplied with the same potential, the first electrode layer 447 and the drain electrode layer 405b, or the second electrode layer 445 and the conductive layer 406 are not necessarily provided in direct contact with each other, and may be supplied with the same potential through another wiring layer (i.e., a potential supplied to another wiring layer).

Therefore, when a voltage is applied to the first electrode layer 447 and the second electrode layer 445, the same voltage can also be applied to the drain electrode layer 405b and the conductive layer 406. Thus, in the liquid crystal layer 444, an electric field can be widely formed between the first electrode layer 447 and the second electrode layer 445 and also in regions of the openings 431 between the drain electrode layer 405b and the conductive layer 406.

In addition, as in this embodiment, when the third electrode layer 446 is provided on the second substrate 442 side as the second common electrode layer, an electric field can be applied to liquid crystal in an oblique direction (in a direction oblique to the substrate) between the first electrode layer 447 and the third electrode layer 446; thus, liquid crystal molecules can be controlled more efficiently.

Figure 12A:
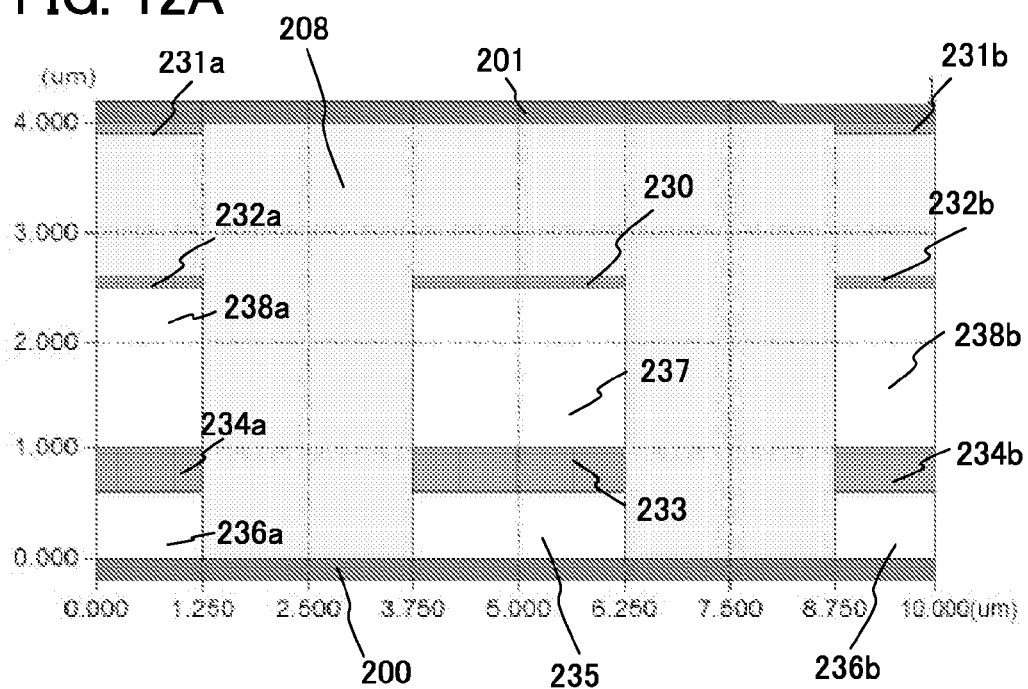
FIGS. 12A and 12B show calculation results of an electric field mode of a liquid crystal display device.
Figure 12B:
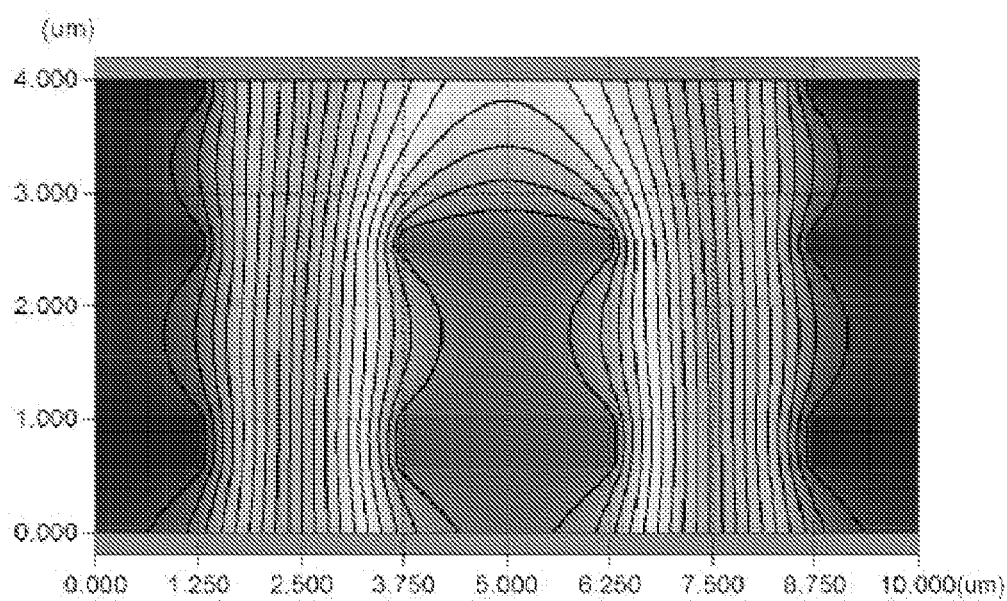

FIG. 12B shows calculation results of an electric field applied in a liquid crystal display device. The calculation was performed using LCD Master, 2s Bench manufactured by SHINTECH, Inc.

FIG. 12A shows the structure of the liquid crystal display device used for calculation. FIG. 12A shows the liquid crystal display device in which the first substrate 200 and the second substrate 201 are positioned so as to face each other and the liquid crystal layer 208 that includes a liquid crystal material exhibiting a blue phase is sandwiched between these substrates. The first substrate 441 in FIG. 3B corresponds to the first substrate 200 in FIG. 12A; the second substrate 442 in FIG. 3B corresponds to the second substrate 201 in FIG. 12A; the first electrode layer 447 in FIGS. 3A and 3B corresponds to the pixel electrode layer 230 in FIG. 12A; the liquid crystal layer 444 in FIG. 3B corresponds to the liquid crystal layer 208 in FIG. 12A; the drain electrode layer 405b in FIGS. 3A and 3B corresponds to the conductive layer 233 in FIG. 12A; the second electrode layer 445 in FIGS. 3A and 3B corresponds to the common electrode layers 232a and 232b in FIG. 12A; the conductive layer 406 in FIG. 3B corresponds to the conductive layers 234a and 234b in FIG. 12A; the gate insulating layer 402 in FIG. 3B corresponds to the interlayer films 235, 236a, and 236b in FIG. 12A; the insulating film 407, the insulating film 409, and the insulating layer 413 in FIG. 3B correspond to interlayer films 237, 238a, and 238b in FIG. 11A; and the third electrode layer 446 in FIGS. 3A and 3B corresponds to the common electrode layers 231a and 231b in FIG. 12A.

Insulators with a dielectric constant of 4 are used for the interlayer films 235, 236a, 236b, 237, 238a, and 238b, and the cross-sectional widths thereof are each set to 2.5 μm. The thicknesses (heights) of the interlayer films 235, 236a, and 236b are each 0.6 μm, and the thicknesses (heights) of the interlayer films 237, 238a, and 238b are each 1.5 μm. Further, in FIGS. 12A and 12B, the common electrode layers 231a and 231b are provided between the second substrate 201 and the liquid crystal layer 208 so as to overlap with the common electrode layers 232a and 232b.

The pixel electrode layer 230 is formed over a stack of the interlayer film 235, the conductive layer 233, and the interlayer film 237; the common electrode layer 232a is formed over a stack of the interlayer film 236a, the conductive layer 234a, and the interlayer film 238a; and the common electrode layer 232b is formed over a stack of the interlayer film 236b, the conductive layer 234b, and the interlayer film 238b. Note that the pixel electrode layer 230 and the conductive layer 233 are electrically connected to each other; and the common electrode layers 232a and 232b and the conductive layers 234a and 234b are electrically connected to each other. Openings reaching the first substrate 200 are formed between the pixel electrode layer 230 and the common electrode layer 232a and between the pixel electrode layer 230 and the common electrode layer 232b, and the liquid crystal layer 208 is also formed in the openings.

The thicknesses of the pixel electrode layer 230, the common electrode layer 232a, and the common electrode layer 232b are each 0.1 μm; the thicknesses of the conductive layers 233, 234a, and 234b are each 0.4 μm; and the distance between the pixel electrode layer 230 and the common electrode layer 232a and the distance between the pixel electrode layer 230 and the common electrode layer 232b are each 2.5 μm. The distance between the first substrate 200 and the second substrate 201, which corresponds to a cell gap (the maximum thickness of the liquid crystal layer), is 4 μm. Note that the distance between the common electrode layer 231a and the common electrode layer 231b is 7.5 μm.

FIG. 12B shows results of calculation performed on the structure of FIG. 12A under the condition where potentials supplied to the common electrode layers 231a and 231b, the common electrode layers 232a and 232b, and the conductive layers 234a and 234b are each set to 0 V and where potentials supplied to the pixel electrode layer 230 and the conductive layer 233 are each set to 10 V.

In FIG. 12B, a solid line represents an equipotential line, and the pixel electrode layer, the common electrode layer, or the conductive layer is positioned in the center of a circular pattern of the equipotential lines.

An electric field is applied perpendicularly to the equipotential line; thus, as shown in FIG. 12B, it can be confirmed that a horizontal electric field is applied between the conductive layer 233 and the pixel electrode layer 230 which are stacked with the interlayer film 237 sandwiched therebetween, between the conductive layer 234a and the common electrode layer 232a which are stacked with the interlayer film 238a sandwiched therebetween, and between the conductive layer 234b and the common electrode layer 232b which are stacked with the interlayer film 238b sandwiched therebetween.

Moreover, an electric field can be formed in an oblique direction between the pixel electrode layer 230 and the common electrode layers 231a and 231b. Thus, an electric field can be more widely formed in the entire liquid crystal layer 208.

An electric field is also formed between pixel electrode layer 230 and the common electrode layers 232a and 232b and between the conductive layer 233 and the conductive layers 234a and 234b; thus, an electric field can be entirely formed in the liquid crystal layer 208 which is included in the opening regions provided on the first substrate 200 side. Further, the second common electrode layer is provided on the second substrate side in a position that does not overlap with the pixel electrode layer, whereby an oblique electric field can be formed between the pixel electrode layer and the second common electrode layer. In such manner, stacked bodies each including the conductive layer and the electrode layer which have the same potential are formed, whereby an electric field can be widely formed in the liquid crystal layer. Accordingly, liquid crystal molecules can be controlled with the use of the electric field.

Therefore, an electric field can be widely formed in the liquid crystal layer 208 in the liquid crystal display device, and liquid crystal molecules can be made to respond in the entire liquid crystal layer 208 including a film thickness direction. Thus, white transmittance can be improved. In addition, the contrast ratio, which is a ratio of white transmittance to black transmittance (light transmittance in black display), can be increased. Further, an electric field can be effectively applied even to a liquid crystal material (liquid crystal mixture) exhibiting a blue phase, which has high viscosity; therefore, a reduction in power consumption can also be achieved.

The method and material for forming the second electrode layer 445 which is the common electrode layer described in Embodiment 1 can be applied to the third electrode layer 446 which is the second common electrode layer.

In the above manner, the contrast ratio of the liquid crystal display device including a liquid crystal layer exhibiting a blue phase can be increased.

In addition, since high white transmittance can be obtained with lower voltage, a reduction in power consumption of the liquid crystal display device can also be achieved.

Embodiment 3

In this embodiment, an example of a transistor that can be applied to a liquid crystal display device disclosed in this specification will be described. There is no particular limitation on the structure of the transistor that can be applied to a liquid crystal display device disclosed in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and below a channel formation region with a gate insulating layer provided therebetween. FIGS. 7A to 7D each illustrate an example of a cross-sectional structure of a transistor.

A transistor 410 illustrated in FIG. 7A is one of bottom-gate thin film transistors and is also called an inverted-staggered thin film transistor.

The transistor 410 includes, over the first substrate 441 having an insulating surface, the gate electrode layer 401, the gate insulating layer 402, the semiconductor layer 403, the source electrode layer 405a, and the drain electrode layer 405b. In addition, the insulating film 407 which covers the transistor 410 and is stacked over the semiconductor layer 403 is provided. The insulating film 409 is provided over the insulating film 407.

A transistor 420 illustrated in FIG. 7B is one of bottom-gate transistors called a channel-protective transistor (a channel-stop transistor) and is also called an inverted-staggered thin film transistor.

The transistor 420 includes, over the first substrate 441 having an insulating surface, the gate electrode layer 401, the gate insulating layer 402, the semiconductor layer 403, an insulating film 427 functioning as a channel protective layer which covers a channel formation region of the semiconductor layer 403, the source electrode layer 405a, and the drain electrode layer 405b. The insulating film 409 is formed so as to cover the transistor 420.

A transistor 430 illustrated in FIG. 7C is a bottom-gate thin film transistor, and includes, over the first substrate 441 having an insulating surface, the gate electrode layer 401, the gate insulating layer 402, the source electrode layer 405a, the drain electrode layer 405b, and the oxide semiconductor layer 403. The insulating film 407 which covers the transistor 430 and is in contact with the semiconductor layer 403 is provided. The insulating film 409 is provided over the insulating film 407.

In the transistor 430, the gate insulating layer 402 is provided on and in contact with the first substrate 441 and the gate electrode layer 401, and the source electrode layer 405a and the drain electrode layer 405b are provided on and in contact with the gate insulating layer 402. Further, the semiconductor layer 403 is provided over the gate insulating layer 402, the source electrode layer 405a, and the drain electrode layer 405b.

A transistor 440 illustrated in FIG. 7D is one of top-gate thin film transistors. The transistor 440 includes, over the first substrate 441 having an insulating surface, an insulating layer 437, the semiconductor layer 403, the source electrode layer 405a, the drain electrode layer 405b, the gate insulating layer 402, and the gate electrode layer 401. A wiring layer 436a and a wiring layer 436b are provided to be in contact with and electrically connected to the source electrode layer 405a and the drain electrode layer 405b, respectively.

As in Embodiment 1 or 2, in each of the transistors 410, 420, 430, and 440, the drain electrode layer 405b electrically connected to a pixel electrode layer is provided so as to overlap with the pixel electrode layer with an interlayer film sandwiched therebetween. A conductive layer formed through the same steps as the drain electrode layer 405b is provided below the common electrode layer with the interlayer film sandwiched therebetween.

A source region (also referred to as a semiconductor layer having one conductivity type or a buffer layer) may be provided between the semiconductor layer and the source electrode layer. For example, for the source region and the drain region, a semiconductor layer having n-type conductivity is used.

When a semiconductor layer is used for the source and drain regions, the semiconductor layer preferably has a smaller thickness and higher conductivity (electrical conductivity) than the semiconductor layer used as the channel formation region.

A material similar to that for the source electrode layer 405a and the drain electrode layer 405b can be used for a conductive film used for the wiring layer 436a and the wiring layer 436b which are connected to the source electrode layer 405a and the drain electrode layer 405b, respectively.

A material similar to that for the insulating film 407 can be used for the insulating films 427 and 437, and an inorganic insulating film such as a silicon oxide film, a silicon oxynitride film, an aluminum oxide film, or an aluminum oxynitride film can be typically used.

In addition, as in Embodiment 1, the insulating layer 413 may be formed as a planarization insulating film over the insulating film 409 in order to reduce surface unevenness due to the transistor.

This embodiment can be implemented in appropriate combination with any of the structures described in the other embodiments.

Embodiment 4

An oxide semiconductor will be described as an example of a material that can be used for the semiconductor layers of the transistors in Embodiments 1 to 3.

In the transistors 410, 420, 430, and 440 illustrated in FIGS. 7A to 7D in Embodiment 3, an oxide semiconductor layer can be used as the semiconductor layer 403.

The oxide semiconductor used for the semiconductor layer 403 can be formed using an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; an In—O-based oxide semiconductor, a Sn—O-based oxide semiconductor, a Zn—O-based oxide semiconductor; or the like. Further, $SiO_2$ may be contained in the above oxide semiconductor. Here, for example, an In—Ga—Zn—O-based oxide semiconductor is an oxide including at least In, Ga, and Zn, and there is no particular limitation on the composition ratio thereof. Furthermore, the In—Ga—Zn—O-based oxide semiconductor may contain an element other than In, Ga, and Zn.

For the oxide semiconductor layer, a thin film represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the transistors 410, 420, 430, and 440 each including the oxide semiconductor layer, the current value in an off-state (off-state current value) can be reduced. Therefore, with the use of the transistor including the oxide semiconductor layer, an electrical signal such as an image signal can be held for a long period, and a writing interval can be set long when the power is on. Accordingly, the frequency of refresh operation can be reduced, which leads to an effect of suppressing power consumption.

In addition, the transistors 410, 420, 430, and 440 each using the oxide semiconductor layer as the semiconductor layer 403 can operate at high speed because relatively high field-effect mobility can be obtained. Therefore, with the use of the transistor for a pixel portion of a liquid crystal display device, a high-quality image can be provided. In addition, by using such transistors, a driver circuit portion and a pixel portion can be separately formed over one substrate; thus, the number of components of the liquid crystal display device can be reduced.

This embodiment can be implemented in appropriate combination with any of the structures described in the other embodiments.

Embodiment 5

In this embodiment, another example of a transistor including an oxide semiconductor layer and another example of a method for manufacturing the transistor including an oxide semiconductor layer will be described in detail with reference to FIGS. 8A to 8E. The same portions as or portions having functions similar to those of the above embodiment can be formed in a manner similar to that described in the above embodiment, and also the steps similar to those in the above embodiment can be performed in a manner similar to that described in the above embodiment; therefore, repetitive description will be omitted. In addition, detailed description of the same portions will be omitted.

FIGS. 8A to 8E illustrate an example of a cross-sectional structure of a transistor. A transistor 510 illustrated in FIGS. 8A to 8E is an inverted-staggered thin film transistor having a bottom-gate structure, which is similar to the transistor 410 illustrated in FIG. 7A.

An oxide semiconductor used for a semiconductor layer in this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which in an n-type impurity, is removed from an oxide semiconductor, and the oxide semiconductor is highly purified so as to contain as few impurities that are not main components of the oxide semiconductor as possible. In other words, a feature is that a highly purified i-type (intrinsic) semiconductor or a semiconductor close thereto is obtained not by adding an impurity but by removing an impurity such as hydrogen or water as much as possible. This enables the Fermi level ($E_f$) to be at the same level as the intrinsic Fermi level ($E_i$). Therefore, the oxide semiconductor layer included in the transistor 510 is an oxide semiconductor layer which is highly purified and made to be electrically i-type (intrinsic).

In addition, the highly purified oxide semiconductor includes extremely few carriers (close to zero), and the carrier concentration is lower than $1\times10^{14}/cm^3$, preferably lower than $1\times10^{12}/cm^3$, more preferably lower than $1\times10^{11}/cm^3$.

Since the oxide semiconductor includes extremely few carriers, the off-state current of the transistor can be reduced. It is preferable that the off-state current be as small as possible.

Specifically, in the transistor 510 including the above oxide semiconductor layer, the current value in an off state (off-state current value) can be reduced to a value lower than 10 zA/μm for a channel width of 1 μm and lower than 100 zA/μm at 85° C.

When a transistor whose current value in an off state (an off-state current value) is extremely small is used as a transistor in a pixel portion, refresh operation in a still image region can be performed with a small number of times of writing image data.

The transistor 510 including the above oxide semiconductor layer hardly has temperature dependence of an on-state current and also has an extremely small off-state current. Further, a change in transistor characteristics due to light deterioration hardly occurs.

A process for manufacturing the transistor 510 over a substrate 505 will be described with reference to FIGS. 8A to 8E.

First, a conductive film is formed over the substrate 505 having an insulating surface, and then a gate electrode layer 511 is formed through a first photolithography step. Note that a resist mask may be formed by an inkjet method. Formation of the resist mask by an inkjet method needs no photomask; thus, manufacturing cost can be reduced.

As the substrate 505 having an insulating surface, a substrate similar to the first substrate 441 described in Embodiment 1 can be used. In this embodiment, a glass substrate is used as the substrate 505.

An insulating film serving as a base film may be provided between the substrate 505 and the gate electrode layer 511. The base film has a function of preventing diffusion of impurity elements from the substrate 505 and can be formed with a single-layer structure or a stacked structure using a silicon nitride film, a silicon oxide film, a silicon nitride oxide film, and/or a silicon oxynitride film.

The gate electrode layer 511 can be formed with a single-layer structure or stacked structure using a metal material such as molybdenum, titanium, tantalum, tungsten, aluminum, copper, neodymium, or scandium, or an alloy which includes any of these materials as a main component.

Next, a gate insulating layer 507 is formed over the gate electrode layer 511. The gate insulating layer 507 can be formed with a single-layer structure or a stacked structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer by a plasma CVD method, a sputtering method, or the like.

For the oxide semiconductor in this embodiment, an oxide semiconductor which is made to be an i-type semiconductor or a substantially i-type semiconductor by removing an impurity is used. Such a highly purified oxide semiconductor is highly sensitive to an interface state and interface charge; thus, an interface between the oxide semiconductor layer and the gate insulating layer is important. For that reason, the gate insulating layer that is to be in contact with the highly purified oxide semiconductor needs to have high quality.

For example, high-density plasma CVD using microwaves (e.g., a frequency of 2.45 GHz) is preferable because a dense high-quality insulating layer having high withstand voltage can be formed. The highly purified oxide semiconductor and the high-quality gate insulating layer are in close contact with each other, whereby the interface state can be reduced and favorable interface characteristics can be obtained.

Needless to say, another film formation method such as a sputtering method or a plasma CVD method can be employed as long as the method enables formation of a high-quality insulating layer as a gate insulating layer. Moreover, it is possible to use as the gate insulating layer an insulating layer whose quality and characteristics of an interface with an oxide semiconductor are improved by heat treatment performed after the formation of the insulating layer. In any case, an insulating layer that can reduce interface state density with an oxide semiconductor to form a favorable interface, as well as having favorable film quality as the gate insulating layer, is formed.

Further, in order that hydrogen, hydroxyl, and moisture might be contained in the gate insulating layer 507 and an oxide semiconductor film 530 as little as possible, it is preferable that the substrate 505 over which the gate electrode layer 511 is formed or the substrate 505 over which layers up to and including the gate insulating layer 507 are formed be preheated in a preheating chamber of a sputtering apparatus as pretreatment for deposition of the oxide semiconductor film 530 so that impurities such as hydrogen and moisture adsorbed to the substrate 505 are eliminated and evacuated. As an evacuation unit provided for the preheating chamber, a cryopump is preferable. Note that this preheating treatment can be omitted. This preheating treatment may be similarly performed on the substrate 505 over which layers up to and including a source electrode layer 515a and a drain electrode layer 515b are formed before formation of an insulating film 516.

Figure 8A:
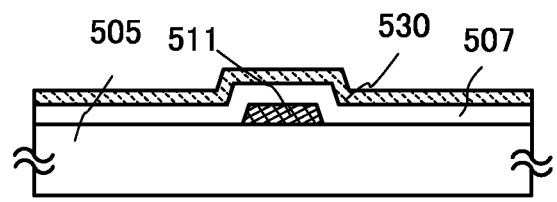
FIGS. 8A to 8E illustrate a transistor which can be applied to a liquid crystal display device and a method for manufacturing the transistor.
Figure 8B:
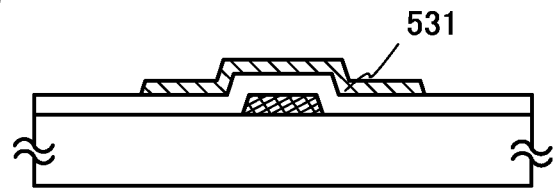
Figure 8C:
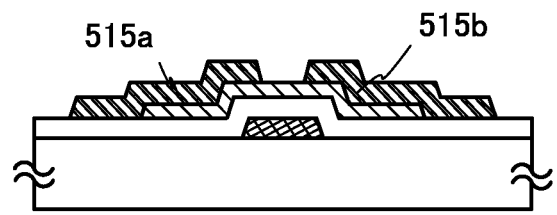

Next, the oxide semiconductor film 530 having a thickness of greater than or equal to 2 nm and less than or equal to 200 nm, preferably greater than or equal to 5 nm and less than or equal to 30 nm is formed over the gate insulating layer 507 (see FIG. 8A).

Note that before the oxide semiconductor film 530 is formed by a sputtering method, powder substances (also referred to as particles or dust) attached to a surface of the gate insulating layer 507 are preferably removed by reverse sputtering in which an argon gas is introduced and plasma is generated. The reverse sputtering refers to a method in which, without application of voltage to a target side, an RF power source is used for application of voltage to a substrate side under an argon atmosphere so that plasma is generated in the vicinity of the substrate to modify a surface. Note that instead of an argon atmosphere, a nitrogen atmosphere, a helium atmosphere, an oxygen atmosphere, or the like may be used.

As an oxide semiconductor used for the oxide semiconductor film 530, an oxide semiconductor described in Embodiment 4, such as a four-component metal oxide, a three-component metal oxide, a two-component metal oxide, an In—O-based oxide semiconductor, a Sn—O-based oxide semiconductor, or a Zn—O-based oxide semiconductor can be used. Further, $SiO_2$ may be contained in the above oxide semiconductor. In this embodiment, the oxide semiconductor film 530 is formed by a sputtering method with the use of an In—Ga—Zn—O-based oxide semiconductor target. A cross-sectional view in this step corresponds to FIG. 8A. Alternatively, the oxide semiconductor film 530 can be formed by a sputtering method in a rare gas (typically, argon) atmosphere, an oxygen atmosphere, or a mixed atmosphere containing a rare gas and oxygen.

As a target for forming the oxide semiconductor film 530 by a sputtering method, for example, a target having a composition ratio of $In_2O_3:Ga_2O_3:ZnO=1:1:1$ [molar ratio] (i.e., In:Ga:Zn=1:1:0.5 [atomic ratio]) can be used. Alternatively, a target having a composition ratio of In:Ga:Zn=1:1:1 [atomic ratio] or In:Ga:Zn=1:1:2 [atomic ratio] may be used. The filling rate of the oxide target is higher than or equal to 90% and lower than or equal to 100%, preferably higher than or equal to 95% and lower than or equal to 99.9%. With the use of the metal oxide target with high filling rate, the deposited oxide semiconductor film has high density.

It is preferable that a high-purity gas from which an impurity such as hydrogen, water, hydroxyl, or hydride is removed be used as the sputtering gas for the deposition of the oxide semiconductor film 530.

The substrate is held in a deposition chamber under reduced pressure, and the substrate temperature is set to 100° C. to 600° C., preferably 200° C. to 400° C. Deposition is performed while the substrate is heated, whereby the impurity concentration in the oxide semiconductor film formed can be reduced. In addition, damage by the sputtering can be reduced. The oxide semiconductor film 530 is formed over the substrate 505 in such a manner that a sputtering gas from which hydrogen and moisture have been removed is introduced into the deposition chamber while moisture remaining therein is removed, and the above-described target is used. In order to remove moisture remaining in the deposition chamber, an entrapment vacuum pump, for example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom such as water ($H_2O$), (more preferably, also a compound containing a carbon atom), and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct-current power source is preferable because powder substances (also referred to as particles or dust) generated in deposition can be reduced and the film thickness can be uniform.

Then, the oxide semiconductor film 530 is processed into an island-shaped oxide semiconductor layer by a second photolithography step. A resist mask for forming the island-shaped oxide semiconductor layer may be formed by an inkjet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

Note that the etching of the oxide semiconductor film 530 may be dry etching, wet etching, or both dry etching and wet etching. As an etchant used for wet etching of the oxide semiconductor film 530, for example, a mixed solution of phosphoric acid, acetic acid, and nitric acid, or the like can be used. Alternatively, ITO-07N (produced by KANTO CHEMICAL CO., INC.) may be used.

Next, the oxide semiconductor layer is subjected to first heat treatment. The oxide semiconductor layer can be dehydrated or dehydrogenated by this first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for one hour in a nitrogen atmosphere, and then, water or hydrogen is prevented from entering the oxide semiconductor layer, without exposure to air; thus, an oxide semiconductor layer 531 is obtained (see FIG. 8B).

The heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA by which the substrate is moved into an inert gas heated to a high temperature as high as 650° C. to 700° C., heated for several minutes, and moved out of the inert gas heated to the high temperature may be performed.

Note that in the first heat treatment, it is preferable that water, hydrogen, and the like be not contained in the atmosphere of nitrogen or a rare gas such as helium, neon, or argon. It is preferable that the purity of nitrogen or a rare gas such as helium, neon, or argon which is introduced into a heat treatment apparatus be 6N (99.9999%) or higher, preferably 7N (99.99999%) or higher (that is, the impurity concentration is 1 ppm or lower, preferably 0.1 ppm or lower).

Further, after the oxide semiconductor layer is heated through the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. It is preferable that the oxygen gas and the $N_2O$ gas do not contain water, hydrogen, and the like. The purity of the oxygen gas or the $N_2O$ gas which is introduced into the heat treatment apparatus is preferably 6N or more, more preferably 7N or higher (i.e., the impurity concentration in the oxygen gas or the $N_2O$ gas is 1 ppm or lower, preferably 0.1 ppm or lower). By the action of the oxygen gas or the $N_2O$ gas, oxygen which is a main component of the oxide semiconductor and which has been reduced at the same time as the step for removing impurities by dehydration or dehydrogenation is supplied, so that the oxide semiconductor layer can be a highly purified and electrically i-type (intrinsic) oxide semiconductor layer.

The first heat treatment for the oxide semiconductor layer can be performed on the oxide semiconductor film 530 that has not been processed into the island-shaped oxide semiconductor layer. In that case, the substrate is taken out of the heat apparatus after the first heat treatment, and then a photolithography step is performed.

Note that the first heat treatment may be performed at any of the following timings in addition to the above timing as long as it is performed after deposition of the oxide semiconductor layer: after the source electrode layer and the drain electrode layer are formed over the oxide semiconductor layer; and after the insulating layer is formed over the source electrode layer and the drain electrode layer.

Further, in the case where a contact hole is formed in the gate insulating layer 507, the formation of the contact hole may be performed either before or after the first heat treatment is performed on the oxide semiconductor film 530.

In addition, as the oxide semiconductor layer, an oxide semiconductor layer having a crystal region (a single crystal region) with a large thickness, that is, a crystal region which is c-axis-aligned perpendicularly to a surface may be formed by performing deposition twice and heat treatment twice, regardless of a material of a base component such as an oxide, a nitride, or a metal. For example, a first oxide semiconductor film with a thickness of greater than or equal to 3 nm and less than or equal to 15 nm is deposited, and first heat treatment is performed in a nitrogen, oxygen, rare gas, or dry air atmosphere at higher than or equal to 450° C. and lower than or equal to 850° C., preferably higher than or equal to 550° C. and lower than or equal to 750° C., so that the first oxide semiconductor film having a crystal region (including a plate-like crystal) in a region including a surface is formed. Then, a second oxide semiconductor film which has a larger thickness than the first oxide semiconductor film is formed, and second heat treatment is performed at higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth and the whole second oxide semiconductor film is crystallized. In such a manner, the oxide semiconductor layer having a crystal region with a large thickness may be formed.

Next, a conductive film to be the source electrode layer and the drain electrode layer (including a wiring formed from the same layer as the source electrode layer and the drain electrode layer) is formed over the gate insulating layer 507 and the oxide semiconductor layer 531. As the conductive film serving as the source electrode layer and the drain electrode layer, the material used for the source electrode layer 405a and the drain electrode layer 405b which is described in Embodiment 1 can be used.

A resist mask is formed over the conductive film in a third photolithography step and selective etching is performed, so that the source electrode layer 515a and the drain electrode layer 515b are formed. Then, the resist mask is removed (see FIG. 8C).

Ultraviolet light, KrF laser light, or ArF laser light is preferably used for light exposure for forming the resist mask in the third photolithography step. The channel length L of the transistor that is completed later is determined by a distance between bottom end portions of the source electrode layer and the drain electrode layer, which are adjacent to each other over the oxide semiconductor layer 531. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. The resolution of light exposure with extreme ultraviolet rays is high and the depth of focus is large. For these reasons, the channel length L of the transistor to be formed later can be longer than or equal to 10 nm and shorter than or equal to 1000 nm, and the circuit can operate at higher speed.

In order to reduce the number of photomasks and the number of steps in photolithography, an etching step may be performed with the use of a resist mask formed using a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for forming different patterns. Therefore, a resist mask corresponding to at least two kinds of different patterns can be formed with one multi-tone mask. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor layer 531 when the conductive film is etched. However, it is difficult to obtain etching conditions under which only the conductive film is etched and the oxide semiconductor layer 531 is not etched at all. In some cases, only part of the oxide semiconductor layer 531 is etched to be an oxide semiconductor layer having a groove portion (a recessed portion) when the conductive film is etched.

In this embodiment, since a Ti film is used as the conductive film and an In—Ga—Zn—O-based oxide semiconductor is used for the oxide semiconductor layer 531, an ammonia hydrogen peroxide mixture (a mixed solution of ammonia, water, and a hydrogen peroxide solution) is used as an etchant.

Next, by plasma treatment using a gas such as $N_2O$, $N_2$, or Ar, water or the like adsorbed to a surface of an exposed portion of the oxide semiconductor layer may be removed. In the case where the plasma treatment is performed, the insulating film 516 serving as a protective insulating film in contact with part of the oxide semiconductor layer is formed without exposure to air.

The insulating film 516 can be formed to a thickness of at least 1 nm by a method through which an impurity such as water or hydrogen does not enter the insulating film 516, such as a sputtering method as appropriate. When hydrogen is contained in the insulating film 516, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. Therefore, it is preferable that a formation method in which hydrogen is not used is employed in order to form the insulating film 516 containing as little hydrogen as possible.

In this embodiment, a silicon oxide film is formed to a thickness of 200 nm as the insulating film 516 by a sputtering method. The substrate temperature in film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen. As the insulating film 516 which is formed in contact with the oxide semiconductor layer, an inorganic insulating film which does not include impurities such as moisture, a hydrogen ion, or OH⁻ and blocks the entry of these impurities from the outside is used. Typically, a silicon oxide film, a silicon oxynitride film, an aluminum oxide film, an aluminum oxynitride film, or the like is used.

In order to remove moisture remaining in the deposition chamber of the insulating film 516 at the same time as deposition of the oxide semiconductor film 530, an entrapment vacuum pump (such as a cryopump) is preferably used. When the insulating film 516 is deposited in the deposition chamber evacuated using a cryopump, the impurity concentration in the insulating film 516 can be reduced. In addition, as an evacuation unit for removing moisture remaining in the deposition chamber of the insulating film 516, a turbo pump provided with a cold trap may be used.

It is preferable that a high-purity gas from which an impurity such as hydrogen, water, hydroxyl, or hydride is removed be used as the sputtering gas for the deposition of the insulating film 516.

Next, second heat treatment (preferably at higher than or equal to 200° C. and lower than or equal to 400° C., for example, higher than or equal to 250° C. and lower than or equal to 350° C.) is performed in an inert gas atmosphere or an oxygen gas atmosphere. For example, the second heat treatment is performed at 250° C. for one hour in a nitrogen atmosphere. In the second heat treatment, part of the oxide semiconductor layer (a channel formation region) is heated in the state where it is in contact with the insulating film 516.

Through the above steps, the first heat treatment is performed on the oxide semiconductor film so that impurities such as hydrogen, moisture, hydroxyl, and hydride (also referred to as a hydrogen compound) are intentionally removed from the oxide semiconductor layer. Additionally, oxygen which is one of main components of an oxide semiconductor and is simultaneously reduced in the step of removing impurities can be supplied. Accordingly, the oxide semiconductor layer is highly purified and is made to be an electrically i-type (intrinsic) semiconductor.

Figure 8D:
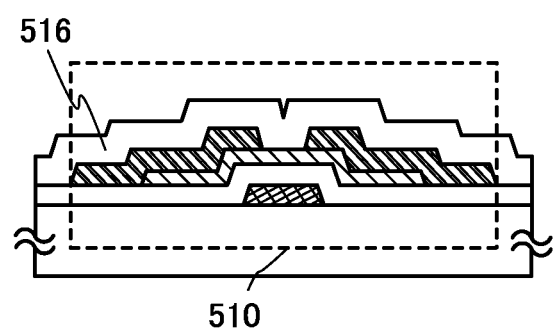
Figure 8E:
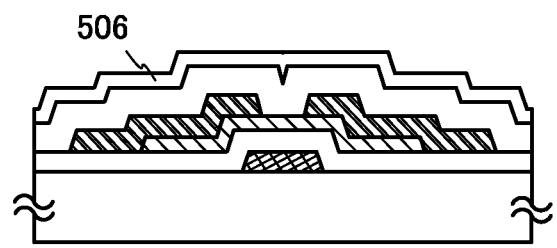

Through the above steps, the transistor 510 is formed (see FIG. 8D).

When a silicon oxide layer having a lot of defects is used as the insulating film 516, heat treatment after formation of the silicon oxide layer has an effect of diffusing impurities such as hydrogen, moisture, hydroxyl, or hydride contained in the oxide semiconductor layer to the insulating film so that the impurities contained in the oxide semiconductor layer can be further reduced.

An insulating film 506 may be formed over the insulating film 516. For example, a silicon nitride film is formed by an RF sputtering method. The RF sputtering method is preferable as a formation method of the protective insulating layer because it achieves high mass productivity. As the protective insulating layer, an inorganic insulating film which does not contain impurities such as moisture and blocks the entry of the impurities from the outside is used; for example, a silicon nitride film, an aluminum nitride film, or the like is used. In this embodiment, the insulating film 506 is formed using a silicon nitride film (see FIG. 8E).

In this embodiment, as the insulating film 506 which is the protective insulating layer, a silicon nitride film is formed in such a manner that the substrate 505 over which layers up to and including the insulating film 516 are formed is heated to a temperature of 100° C. to 400° C., a sputtering gas containing high-purity nitrogen from which hydrogen and moisture are removed is introduced, and a target of a silicon semiconductor is used. Also in that case, the insulating film 506 is preferably formed while moisture remaining in the treatment chamber is removed, similarly to the insulating film 516.

After the protective insulating layer is formed, heat treatment may be further performed at a temperature higher than or equal to 100° C. and lower than or equal to 200° C. for longer than or equal to 1 hour and shorter than or equal to 30 hours in air. This heat treatment may be performed at a fixed heating temperature. Alternatively, the following change in temperature may be conducted plural times repeatedly: the heating temperature is increased from room temperature to a temperature of 100° C. to 200° C. and then decreased to room temperature.

Although not illustrated, the insulating layer 413 is formed over the insulating film 409. Through the above steps, the element substrate is completed, which corresponds to the step illustrated in FIG. 2C in Embodiment 1. Therefore, the subsequent steps may be performed as in Embodiment 1.

As described above, with the use of the transistor including a highly purified oxide semiconductor layer manufactured using this embodiment, the current value in an off state (off-state current value) can be further reduced. Accordingly, in driving, an electrical signal such as an image signal can be held for a long period, and a writing interval can be set long. Therefore, the frequency of refresh operation can be reduced, which leads to a higher effect of suppressing power consumption.

The size of a storage capacitor formed in the liquid crystal display device is set in consideration of the leakage current of the transistor provided in the pixel portion or the like so that charge can be held for a predetermined period. The size of the storage capacitor may be set in consideration of the off-state current of a transistor or the like. When the transistor which includes a highly purified oxide semiconductor layer and is described in this embodiment is used, it is enough to provide a storage capacitor having a capacitance which is ⅓ or less, preferably ⅕ or less, of a liquid crystal capacitance in each pixel.

In addition, since the transistor including a highly purified oxide semiconductor layer has high field-effect mobility, high-speed operation is possible. Therefore, with the use of the transistor for a pixel portion of a liquid crystal display device, a high-quality image can be provided. In addition, by using such transistors, a driver circuit portion and a pixel portion can be separately formed over one substrate; thus, the number of components of the liquid crystal display device can be reduced.

When a liquid crystal material exhibiting a blue phase is used, rubbing treatment on an alignment film is unnecessary, which makes it possible to prevent electrostatic discharge damage caused by the rubbing treatment, and to reduce defects of and damage to the liquid crystal display device such as a change in electrical characteristics of the transistor due to the influence of static electricity generated in the manufacturing process. Thus, liquid crystal display devices can be manufactured with improved productivity.

The response speed of a liquid crystal material exhibiting a blue phase is greater than or equal to ten times as high as that of a conventional liquid crystal material; therefore, by combining the blue-phase liquid crystal material with a device capable of double-frame rate (high-speed) driving, such as a transistor including an oxide semiconductor layer, a liquid crystal display device having a higher function and higher response speed can be realized.

Accordingly, as in this embodiment, it is more effective to use a liquid crystal material exhibiting a blue phase for a liquid crystal display device including a transistor that includes an oxide semiconductor layer.

This embodiment can be implemented in appropriate combination with any of the structures described in the other embodiments.

Embodiment 6

Another example of a material that can be used for any of the semiconductor layers of the thin film transistors of Embodiments 1 to 3 will be described.

The semiconductor layer included in a semiconductor element can be formed using the following material: an amorphous semiconductor (hereinafter also referred to as an "AS") manufactured by a sputtering method or a vapor-phase growth method using a semiconductor material gas typified by silane or germane; a polycrystalline semiconductor formed by crystallizing the amorphous semiconductor with the use of light energy or thermal energy; a microcrystalline semiconductor; or the like. The semiconductor layer can be formed by a sputtering method, an LPCVD method, a plasma CVD method, or the like.

The microcrystalline semiconductor film can be formed by a high-frequency plasma CVD method with a frequency of several tens to several hundreds of megahertz or a microwave plasma CVD apparatus with a frequency of 1 GHz or more. Typically, the microcrystalline semiconductor film can be formed using a gas obtained by diluting silicon hydride such as $SiH_4$, $Si_2H_6$, $SiH_2Cl_2$, $SiHCl_3$, $SiCl_4$, or $SiF_4$, with hydrogen. Alternatively, the microcrystalline semiconductor film can be formed by using a gas including silicon hydride and hydrogen which is diluted with one or more rare gas elements selected from helium, argon, krypton, and neon. In that case, the flow ratio of hydrogen to silicon hydride is 5:1 to 200:1, preferably 50:1 to 150:1, more preferably 100:1.

A typical example of an amorphous semiconductor is hydrogenated amorphous silicon, while a typical example of a crystalline semiconductor is polysilicon or the like. Polysilicon includes so-called high-temperature polysilicon formed using polysilicon which is formed at processing temperatures of 800° C. or more as a main material, so-called low-temperature polysilicon formed using polysilicon which is formed at processing temperatures of 600° C. or less as a main material, polysilicon formed by crystallization of amorphous silicon using an element that promotes crystallization or the like, and the like. Needless to say, as described above, a microcrystalline semiconductor, or a semiconductor which includes a crystalline phase in part of a semiconductor layer can be used.

In the case of using a crystalline semiconductor film for the semiconductor layer, the crystalline semiconductor film may be formed by various methods (such as a laser crystallization method, a thermal crystallization method, or a thermal crystallization method using an element which promotes crystallization, such as nickel). Also, a microcrystalline semiconductor, which is an SAS, can be crystallized by laser irradiation to increase its crystallinity. In the case where an element which promotes crystallization is not used, before an amorphous silicon film is irradiated with laser light, the amorphous silicon film is heated at 500° C. for one hour in a nitrogen atmosphere so that the concentration of hydrogen contained in the amorphous silicon film becomes $1 \times 10^{20}$ atoms/cm$^3$ or less. This is because the amorphous silicon film is destroyed when the amorphous silicon film containing a large amount of hydrogen is irradiated with laser light.

A technique for introducing a metal element into an amorphous semiconductor film is not particularly limited as long as it is a technique capable of providing the metal element on a surface or inside of the amorphous semiconductor film. For example, a sputtering method, a CVD method, a plasma processing method (including a plasma CVD method), an adsorption method, or a method for coating a solution of metal salt, can be used. Among them, the method using a solution is simple and advantageous in that the concentration of the metal element can be easily controlled. At this time, an oxide film is preferably deposited by UV light irradiation in an oxygen atmosphere, thermal oxidation, treatment with ozone water or hydrogen peroxide including a hydroxyl radical, or the like in order to improve the wettability of the surface of the amorphous semiconductor film and to spread an aqueous solution on the entire surface of the amorphous semiconductor film.

In a crystallization step through which an amorphous semiconductor film is crystallized to form a crystalline semiconductor film, an element which promotes crystallization (also referred to as a catalytic element or a metal element) may be added to the amorphous semiconductor film, and crystallization may be performed by heat treatment (at 550° C. to 750° C. for 3 minutes to 24 hours). As the element which promotes (accelerates) crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe). A semiconductor film containing a rare gas element is formed in contact with the crystalline semiconductor film containing the element that promotes crystallization, and then heat treatment is performed (at 550° C. to 750° C. for 3 minutes to 24 hours). The element promoting crystallization that is contained in the crystalline semiconductor film moves into the semiconductor film containing a rare gas element, and thus the element promoting crystallization that is contained in the crystalline semiconductor film is removed or reduced. After that, the semiconductor film containing a rare gas element, which has functioned as the gettering sink, is removed.

The amorphous semiconductor film may be crystallized by a combination of heat treatment and laser light irradiation. Alternatively, either heat treatment or laser light irradiation may be performed plural times.

A crystalline semiconductor film can also be formed directly over the substrate by a plasma method. Furthermore, a crystalline semiconductor film may be selectively formed over the substrate by a plasma method.

This embodiment can be implemented in appropriate combination with any of the structures described in the other embodiments.

Embodiment 7

A transistor is manufactured, and a liquid crystal display device having a display function can be manufactured using the transistor in a pixel portion and further in a driver circuit. Further, part or the whole of the driver circuit can be formed over the same substrate as the pixel portion, using the transistor, whereby a system-on-panel can be obtained.

In addition, the liquid crystal display device includes a panel in which the liquid crystal element is sealed, and a module in which an IC or the like including a controller is mounted on the panel. One embodiment of the present invention also relates to an element substrate, which corresponds to one mode before the liquid crystal element is completed in a manufacturing process of the display device, and the element substrate is provided with means for supplying current to the liquid crystal element in each of a plurality of pixels. Specifically, the element substrate may be in a state after only a pixel electrode of the liquid crystal element is formed, a state after a conductive film to be a pixel electrode is formed and before the conductive film is etched to form the pixel electrode, or any of other states.

Note that a liquid crystal display device in this specification means an image display device or a display device. Furthermore, the liquid crystal display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

Figure 5B:
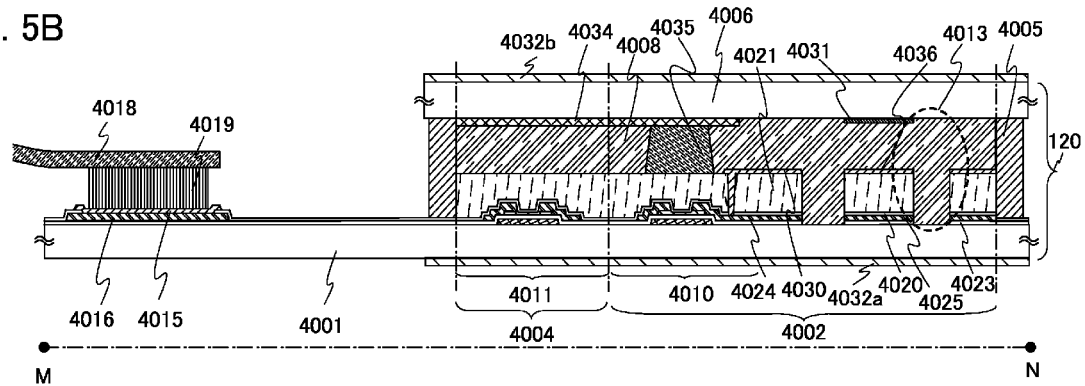

The appearance and a cross section of a liquid crystal display panel 120, which is one embodiment of a liquid crystal display device, will be described with reference to FIGS. 5A1, 5A2 and 5B. FIGS. 5A1 and 5A2 are each a top view of a panel in which transistors 4010 and 4011 formed over a first substrate 4001 and a liquid crystal element 4013 are sealed between the first substrate 4001 and a second substrate 4006 with a sealant 4005. FIG. 5B is a cross-sectional view taken along line M-N of FIGS. 5A1 and 5A2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006.

In FIG. 5A1, a signal line driver circuit 4003 that is formed using a single crystal semiconductor film or a polycrystalline semiconductor film over a substrate separately prepared is mounted in a region different from the region surrounded by the sealant 4005 over the first substrate 4001. Note that FIG. 5A2 illustrates an example in which part of the signal line driver circuit is formed using a transistor provided over the first substrate 4001. A signal line driver circuit 4003b is formed over the first substrate 4001, and a signal line driver circuit 4003a formed using a single crystal semiconductor film or a polycrystalline semiconductor film is mounted on a substrate separately prepared.

Note that there is no particular limitation on the connection method of a driver circuit which is separately formed, and COG, wire bonding, TAB, or the like can be used. FIG. 5A1 illustrates an example of mounting the signal line driver circuit 4003 by COG, and FIG. 5A2 illustrates an example of mounting the signal line driver circuit 4003 by TAB.

The pixel portion 4002 and the scanning line driver circuit 4004 provided over the first substrate 4001 each include a plurality of transistors. FIG. 5B illustrates the transistor 4010 included in the pixel portion 4002 and the transistor 4011 included in the scanning line driver circuit 4004. An insulating film 4020 and an insulating layer 4021 are provided over the transistors 4010 and 4011.

As the transistors 4010 and 4011, the transistor which is described in any of Embodiments 1 to 6 can be employed. The transistors 4010 and 4011 are n-channel thin film transistors.

Further, a conductive layer may be provided over the interlayer layer 4021 or the insulating film 4020 so as to overlap with a channel formation region of a semiconductor layer of the transistor 4011 for the driver circuit. The conductive layer may have the same potential as or a potential different from that of a gate electrode layer of the transistor 4011 and can function as a second gate electrode layer. The potential of the conductive layer may be GND, 0V, or in a floating state.

The liquid crystal element 4013 includes the pixel electrode layer 4030, a second common electrode layer 4031, the first common electrode layer 4036, and the liquid crystal layer 4008. Note that a polarizing plate 4032a and a polarizing plate 4032b are provided on the outer sides of the first substrate 4001 and the second substrate 4006, respectively. In this embodiment, an example in which the second common electrode layer 4031 is further provided on the second substrate 4006 side is described, and the second common electrode layer 4031 is stacked over the pixel electrode layer 4030 and the first common electrode layer 4036 with the liquid crystal layer 4008 interposed therebetween. A structure in which the second common electrode layer 4031 is not provided as in Embodiment 1 may be employed.

Through the interlayer films (a gate insulating layer 4023, the insulating film 4020, and the insulating layer 4021), the pixel electrode layer 4030 is electrically connected to (or supplied with the same potential as) a drain electrode layer 4024 of the transistor 4010. The first common electrode layer 4036 is electrically connected to (or supplied with the same potential as) a conductive layer 4025 formed through the same steps as the drain electrode layer 4024. The interlayer films (the gate insulating layer 4023, the insulating film 4020, and the insulating layer 4021) between the pixel electrode layer 4030 and the first common electrode layer 4036 are selectively removed, so that openings are formed. The openings are filled with liquid crystal, so that the liquid crystal layer 4008 is formed.

Therefore, when a voltage is applied to the pixel electrode layer 4030 and the first common electrode layer 4036, the same voltage can also be applied to the drain electrode layer 4024 and the conductive layer 4025. Thus, in the liquid crystal layer 4008, an electric field can be widely formed between the pixel electrode layer 4030 and the first common electrode layer 4036 and also in an opening region between the drain electrode layer 4024 and the conductive layer 4025. Accordingly, liquid crystal molecules can be controlled with the use of the electric field.

In addition, when the second common electrode layer 4031 is provided on the second substrate 4006 side, an electric field can be applied to liquid crystal in an oblique direction (in a direction oblique to the substrate) between the pixel electrode layer 4030 and the second common electrode layer 4031; thus, liquid crystal molecules can be controlled more efficiently.

Therefore, the liquid crystal molecules in the entire liquid crystal layer including a film thickness direction can be made to respond and white transmittance can be improved. Accordingly, the contrast ratio, which is a ratio of white transmittance to black transmittance, can also be increased.

Note that the first substrate 4001 and the second substrate 4006 can be made of glass, plastic, or the like having a light-transmitting property. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the thickness of the liquid crystal layer 4008 (a cell gap). Alternatively, a spherical spacer may also be used. In the liquid crystal display device including the liquid crystal layer 4008, the cell gap which is the thickness of the liquid crystal layer is preferably greater than or equal to 1 μm and less than or equal to 20 μm.

Although FIGS. 5M, 5A2, and 5B illustrate examples of transmissive liquid crystal display devices, one embodiment of the present invention can also be applied to a semi-transmissive liquid crystal display device.

FIGS. 5A1, 5A2, and 5B illustrate examples of liquid crystal display devices in which a polarizing plate is provided on the outer side (the view side) of a pair of substrates; however, the polarizing plate may be provided on the inner side of the pair of the substrate. The position of the polarizing plate may be determined as appropriate depending on the material of the polarizing plate and conditions of the manufacturing process. Furthermore, a light-blocking layer serving as a black matrix may be provided.

In FIGS. 5A1, 5A2, and 5B, a light-blocking layer 4034 is provided on the second substrate 4006 side so as to cover the transistors 4010 and 4011. By the light-blocking layer 4034, improvement in contrast and stabilization of the transistors can be achieved.

The transistors may be covered with the insulating film 4020 which functions as a protective film of the transistors; however, there is no particular limitation.

Note that the protective film is provided to prevent entry of impurities contained in air, such as an organic substance, a metal substance, or water vapor, and is preferably a dense film. The protective film may be formed with a single-layer structure or a stacked structure using a silicon oxide film, a silicon nitride film, a silicon oxynitride film, a silicon nitride oxide film, an aluminum oxide film, an aluminum nitride film, an aluminum oxynitride film, or an aluminum nitride oxide film by a sputtering method.

Further, in the case of further forming a light-transmitting insulating layer as a planarizing insulating film, the light-transmitting insulating layer can be formed using an organic material having heat resistance, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the formation method of the insulating layer having a stacked structure, and any of the following can be employed depending on the material: methods such as sputtering, an SOG method, spin coating, dip coating, spray coating, and droplet discharging (e.g., ink jetting, screen printing, or offset printing); tools (equipment) such as doctor knife, roll coating, curtain coating, knife coating; and the like. In the case of forming the insulating layer using a material solution, heat treatment (200° C. to 400° C.) of the semiconductor layer may be performed at the same time as a baking step. The baking step of the insulating layer serves also as the heat treatment of the semiconductor layer, whereby a liquid crystal display device can be manufactured efficiently.

The pixel electrode layer 4030, the second common electrode layer 4031, and the first common electrode layer 4036 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode layer 4030, the second common electrode layer 4031, and the first common electrode layer 4036 can be formed using any one or more of the following: metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

A conductive composition containing a conductive high molecule (also referred to as a conductive polymer) can be used for the pixel electrode layer 4030, the second common electrode layer 4031, and the first common electrode layer 4036.

Further, a variety of signals and potentials are supplied to the signal line driver circuit 4003 which is formed separately, the scan line driver circuit 4004, or the pixel portion 4002 from an FPC 4018.

Further, since the transistor is easily broken by static electricity and the like, a protection circuit for protecting the driver circuits is preferably provided over the same substrate as a gate line or a source line. The protection circuit is preferably formed using a nonlinear element.

In FIGS. 5A1, 5A2, and 5B, a connection terminal electrode 4015 is formed using the same conductive film as the pixel electrode layer 4030, and a terminal electrode 4016 is formed using the same conductive film as source electrode layers and drain electrode layers of the transistors 4010 and 4011.

The connection terminal electrode 4015 is electrically connected to a terminal included in the FPC 4018 through an anisotropic conductive film 4019.

FIGS. 5A1, 5A2, and 5B illustrate an example in which the signal line driver circuit 4003 is formed separately and mounted on the first substrate 4001; however, one embodiment of the present invention is not limited to this structure. The scan line driver circuit may be separately formed and then mounted, or only part of the signal line driver circuit or part of the scan line driver circuit may be separately formed and then mounted.

Figure 6:
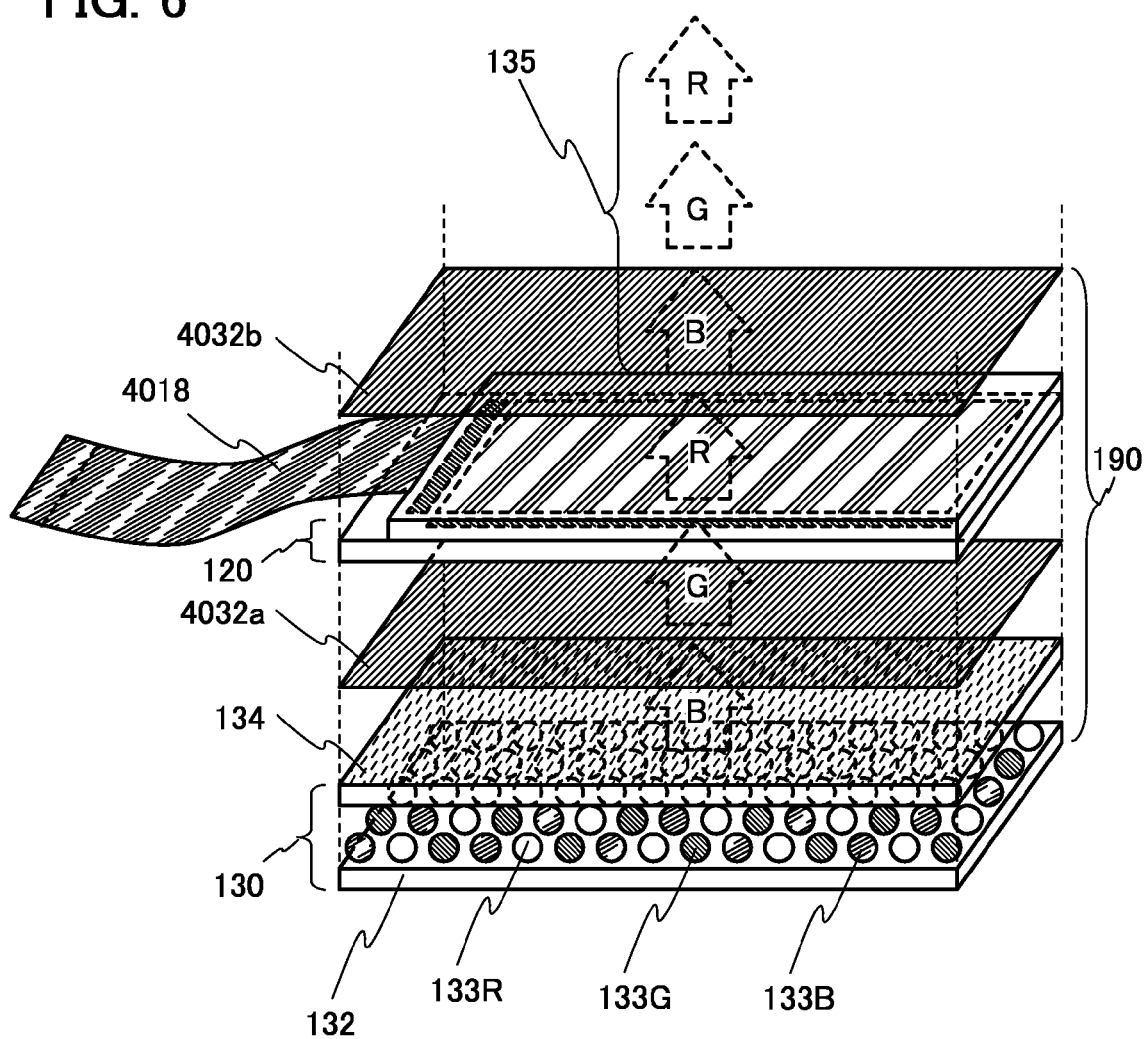
FIG. 6 illustrates a liquid crystal display module.

An example of forming a liquid crystal display module as a liquid crystal display device disclosed in this specification is described. In this embodiment, a structure of a liquid crystal display module 190 is illustrated in FIG. 6 as an example of a liquid crystal display module which displays color images.

The liquid crystal display module 190 includes a backlight portion 130; a liquid crystal display panel 120 in which liquid crystal elements are arranged in matrix; and a polarizing plate 4032a and a polarizing plate 4032b which are provided with the liquid crystal display panel 120 sandwiched therebetween. The backlight portion 130 may be a backlight portion including light-emitting elements, for example, LEDs of three primary colors (133R, 133G, and 133B) arranged in matrix and a diffusion plate 134 provided between the display panel 120 and the light-emitting elements. In addition, the FPC 4018 serving as an external input terminal is electrically connected to a terminal portion provided in the liquid crystal display panel 120.

In this embodiment, a successive additive color mixing method (a field sequential method) in which color display is performed by time division using light-emitting diodes (LEDs) is employed The backlight portion 130 includes a backlight control circuit and a backlight 132. Light-emitting elements 133 are arranged in the backlight 132.

In this embodiment, the backlight 132 includes a plurality of light-emitting elements 133 which emit light of different colors. As a combination of light of different colors, for example, light-emitting elements which emit light of three colors (red (R), green (G), and blue (B)) can be used. Three primary colors of R, G, and B are used, whereby a full-color image can be displayed.

In addition to the light-emitting elements of R, G, and B, another light-emitting element may be provided which emits a color obtained when two or more of the light-emitting elements of R, G, and B emit light at the same time (for example, yellow (Y) expressed by R and G, cyan (C) expressed by G and B, magenta (M) expressed by B and R, or the like).

In order to improve the color reproduction characteristics of the liquid crystal display device, a light-emitting element emitting light of a color other than the three primary colors may also be added. The color that can be expressed using the light-emitting elements of R, G, and B is limited to colors existing in the triangle made by the three points on the chromaticity diagram which correspond to the emission colors of the respective light-emitting elements. Therefore, by additionally providing a light-emitting element of a color existing outside the triangle on the chromaticity diagram, the color reproduction characteristics of the display device can be improved.

For example, a light-emitting element emitting the following color can be used in addition to the light-emitting elements of R, G, and B in the backlight 132: deep blue (DB) represented by a point positioned substantially outside the triangle in a direction from the center of the chromaticity diagram toward the point on the chromaticity diagram corresponding to the blue-light-emitting element B; or deep red (DR) represented by a point positioned substantially outside the triangle in a direction from the center of the chromaticity diagram toward the point on the chromaticity diagram corresponding to the red-light-emitting element R.

In FIG. 6, light 135 of three colors is schematically denoted by arrows (R, G, and B). Pulsed light of different colors sequentially emitted from the backlight portion 130 is modulated by a liquid crystal element of the liquid crystal display panel 120 which operates in synchronization with the backlight portion 130, and reaches a viewer through the liquid crystal display module 190. The viewer perceives the sequentially emitted light as an image.

The liquid crystal display device described in this embodiment can display not only a still image but also a full-color image without using a color filter. Light use efficiency is high because a color filter does not absorb light from the backlight, whereby power consumption is suppressed even in display of a full-color image.

In the above manner, the contrast ratio of the liquid crystal display device including the liquid crystal layer exhibiting a blue phase can be increased.

In addition, since high white transmittance can be obtained with lower voltage, a reduction in power consumption of the liquid crystal display device can also be achieved.

This embodiment can be implemented in appropriate combination with any of the structures described in the other embodiments.

Embodiment 8

A liquid crystal display device disclosed in this specification can be applied to a variety of electronic devices (including a game machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large game machine such as a pinball machine, and the like. Examples of electronic devices each including the liquid crystal display device described in any of the above embodiments will be described.

Figure 9A:
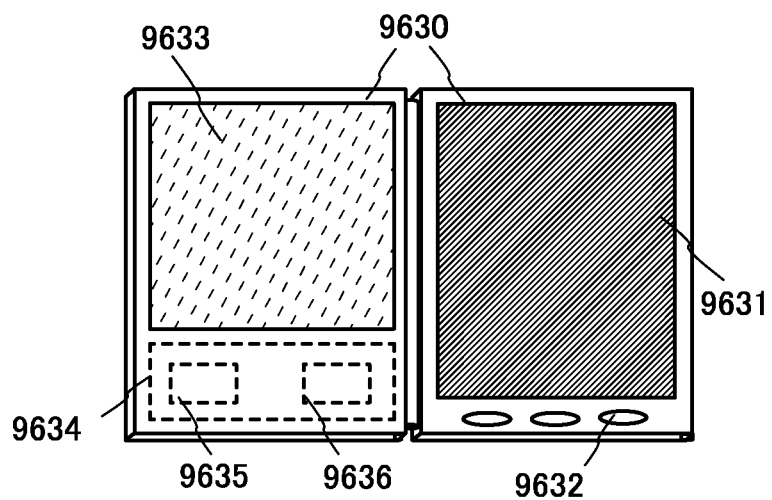
FIGS. 9A and 9B illustrate an electronic device.

FIG. 9A illustrates an electronic book reader (also referred to as an e-book reader) that can include housings 9630, a display portion 9631, operation keys 9632, a solar cell 9633, and a charge and discharge control circuit 9634. The electronic book reader in FIG. 9A can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. Note that in FIG. 9A, a structure including a battery 9635 and a DCDC converter (hereinafter abbreviated as a converter) 9636 is illustrated as an example of the charge and discharge control circuit 9634. The liquid crystal display device described in any of Embodiments 1 to 7 is used for the display portion 9631, whereby an electronic book reader with high contrast, excellent visibility, and low power consumption can be provided.

In the case of using a semi-transmissive or reflective liquid crystal display device as the display portion 9631 in the structure illustrated in FIG. 9A, the electronic book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is also preferable. When a lithium ion battery is used as the battery 9635, there is an advantage of downsizing or the like.

Figure 9B:
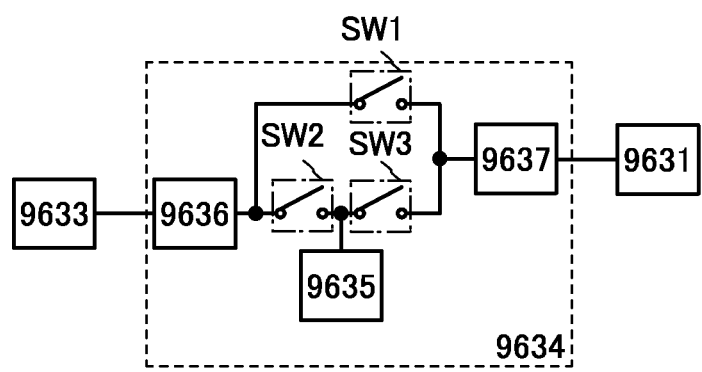

The structure and the operation of the charge and discharge control circuit 9634 illustrated in FIG. 9A are described with reference to a block diagram in FIG. 9B. The solar cell 9633, the battery 9635, the converter 9636, a converter 9637, switches SW1 to SW3, and the display portion 9631 are illustrated in FIG. 9B, and the battery 9635, the converter 9636, the converter 9637, and the switches SW1 to SW3 correspond to the charge and discharge control circuit 9634.

First, an example of the operation in the case where power is generated by the solar cell 9633 using external light is described. The voltage of power generated by the solar cell is raised or lowered by the converter 9636 so as to be voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Next, the operation in the case where power is not generated by the solar cell 9633 using external light is described. The voltage of power stored in the battery 9635 is raised or lowered by the converter 9637 by turning on the switch SW3. Then, power from the battery 9635 is used for the operation of the display portion 9631.

Note that although the solar cell 9633 is described as an example of a means for charge, charge of the battery 9635 may be performed with another means. In addition, a combination of the solar cell 9633 and another means for charge may be used.

Figure 10A:
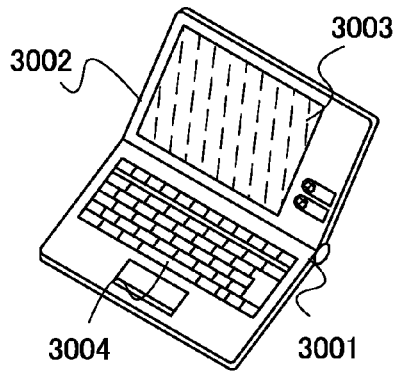
FIGS. 10A to 10F each illustrate an electronic device.

FIG. 10A illustrates a laptop personal computer, which includes a main body 3001, a housing 3002, a display portion 3003, a keyboard 3004, and the like. The liquid crystal display device described in any of Embodiments 1 to 7 is used for the display portion 3003, whereby a laptop personal computer with high contrast, excellent visibility, and low power consumption can be provided.

Figure 10B:
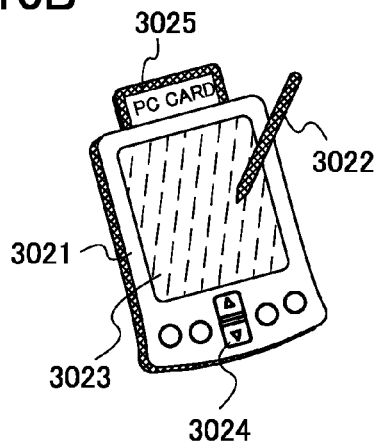

FIG. 10B is a personal digital assistant (PDA) including a display portion 3023, an external interface 3025, an operation button 3024, and the like in a main body 3021. In addition, a stylus 3022 is included as an accessory for operation. The liquid crystal display device described in any of Embodiments 1 to 7 is used for the display portion 3023, whereby a personal digital assistant (PDA) with high contrast, excellent visibility, and low power consumption can be provided.

Figure 10C:
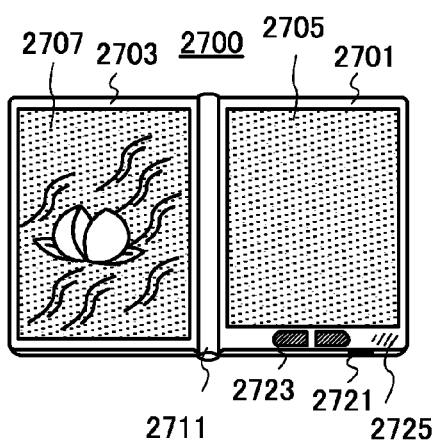

FIG. 10C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in the above display portions, for example, the right display portion (the display portion 2705 in FIG. 10C) can display text and the left display portion (the display portion 2707 in FIG. 10C) can display images. The liquid crystal display device described in any of Embodiments 1 to 7 is used for the display portions 2705 and 2707, whereby an electronic book reader with high contrast, excellent visibility, and low power consumption can be provided.

FIG. 10C illustrates the example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 10D:
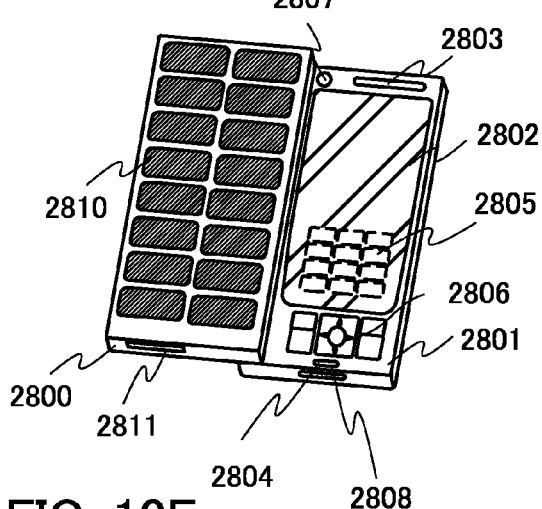

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for charging the mobile phone, an external memory slot 2811, and the like. Further, an antenna is incorporated in the housing 2801. The liquid crystal display device described in any of Embodiments 1 to 7 is used for the display panel 2802, whereby a mobile phone with high contrast, excellent visibility, and low power consumption can be provided.

The display panel 2802 is provided with a touch panel. A plurality of operation keys 2805 which are displayed as images are illustrated by dashed lines in FIG. 10D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as illustrated in FIG. 10D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 10E:
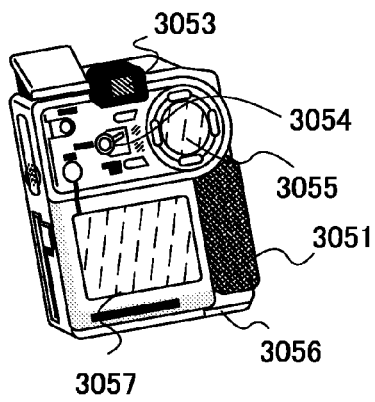

FIG. 10E illustrates a digital video camera which includes a main body 3051, a display portion A 3057, an eyepiece 3053, an operation switch 3054, a display portion B 3055, a battery 3056, and the like. The liquid crystal display device described in any of Embodiments 1 to 7 is used for the display portion A 3057 and the display portion B 3055, whereby a digital video camera with high contrast, excellent visibility, and low power consumption can be provided.

Figure 10F:
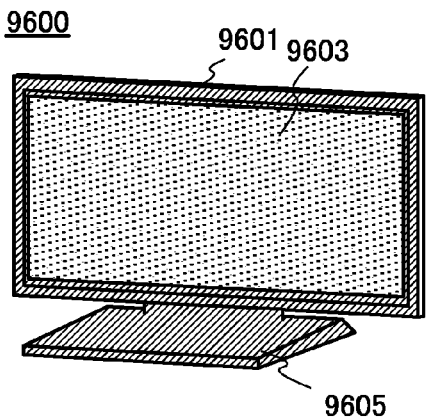

FIG. 10F illustrates an example of a television set. In a television set 9600, a display portion 9603 is incorporated in a housing 9601. The display portion 9603 can display images. Here, the housing 9601 is supported by a stand 9605. The liquid crystal display device described in any of Embodiments 1 to 7 is used for the display portion 9603, whereby a television set with high contrast, excellent visibility, and low power consumption can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be implemented in appropriate combination with any of the structures described in the other embodiments.

This application is based on Japanese Patent Application serial no. 2010-091712 filed with Japan Patent Office on Apr. 12, 2010, the entire contents of which are hereby incorporated by reference.

What is claimed is:

1. A liquid crystal display device comprising:
    a substrate;
    a transistor comprising a gate insulating layer, a semiconductor layer, and a source electrode and a drain electrode electrically connected to the semiconductor layer, over the substrate;
    a conductive layer over the substrate;
    an interlayer insulating film over the transistor and the conductive layer;
    a first electrode layer electrically connected to one of the source electrode and the drain electrode, the first electrode layer being on and in contact with the interlayer insulating film;
    a second electrode layer electrically connected to the conductive layer, the second electrode layer being on and in contact with the interlayer insulating film; and
    a liquid crystal layer including a liquid crystal material exhibiting a blue phase,
    wherein the one of the source electrode and the drain electrode, the interlayer insulating film, and the first electrode layer are stacked,
    wherein the conductive layer, the interlayer insulating film, and the second electrode layer are stacked,
    wherein the one of the source electrode and the drain electrode and the conductive layer are spaced apart from each other,
    wherein the interlayer insulating film and the gate insulating layer have an opening between the first electrode layer and the second electrode layer,
    wherein the liquid crystal layer is included in the opening,
    wherein the substrate and side surfaces of the gate insulating layer, the one of the source electrode and the drain electrode, the interlayer insulating film, the first electrode layer, the conductive layer, and the second electrode layer are exposed in the opening, and
    wherein the substrate and the side surfaces of the gate insulating layer, the one of the source electrode and the drain electrode, the interlayer insulating film, the first electrode layer, the conductive layer, and the second electrode layer are in contact with the liquid crystal layer.

2. The liquid crystal display device according to claim 1, wherein the first electrode layer and the second electrode layer each have a comb-like shape.

3. The liquid crystal display device according to claim 1, further comprising a second insulating layer on and in contact with the one of the source electrode and the drain electrode and the conductive layer,
    wherein the second insulating layer is interposed between the transistor and the interlayer insulating film.

4. The liquid crystal display device according to claim 1, wherein the liquid crystal layer includes a photocurable resin and a photopolymerization initiator.

5. A liquid crystal display device comprising:
    a first substrate;
    a transistor comprising a gate insulating layer, a semiconductor layer, and a source electrode and a drain electrode electrically connected to the semiconductor layer, over the first substrate;
    a conductive layer over the first substrate;
    an interlayer insulating film over the transistor and the conductive layer;
    a first electrode layer electrically connected to one of the source electrode and the drain electrode, the first electrode layer being on and in contact with the interlayer insulating film;
    a second electrode layer electrically connected to the conductive layer, the second electrode layer being on and in contact with the interlayer insulating film; and
    a liquid crystal layer including a liquid crystal material exhibiting a blue phase, over the first electrode layer and the second electrode layer;
    a third electrode layer overlapping with the second electrode layer, over the liquid crystal layer; and
    a second substrate over the third electrode layer,
    wherein the one of the source electrode and the drain electrode, the interlayer insulating film, and the first electrode layer are stacked,
    wherein the conductive layer, the interlayer insulating film, and the second electrode layer are stacked,
    wherein the one of the source electrode and the drain electrode and the conductive layer are spaced apart from each other,
    wherein the interlayer insulating film and the gate insulating layer have an opening between the first electrode layer and the second electrode layer,
    wherein the liquid crystal layer is included in the opening,
    wherein the first substrate and side surfaces of the gate insulating layer, the one of the source electrode and the drain electrode, the interlayer insulating film, the first electrode layer, the conductive layer, and the second electrode layer are exposed in the opening, and
    wherein the first substrate and the side surfaces of the gate insulating layer, the one of the source electrode and the drain electrode, the interlayer insulating film, the first electrode layer, the conductive layer, and the second electrode layer are in contact with the liquid crystal layer.

6. The liquid crystal display device according to claim 5, wherein the first electrode layer, the second electrode layer, and the third electrode layer each have a comb-like shape.

7. The liquid crystal display device according to claim 5, further comprising a second insulating layer on and in contact with the one of the source electrode and the drain electrode and the conductive layer,
   wherein the second insulating layer is interposed between the transistor and the interlayer insulating film.

8. The liquid crystal display device according to claim 5,
   wherein the liquid crystal layer includes a photocurable resin and a photopolymerization initiator.

9. The liquid crystal display device according to claim 1,
   wherein the second electrode layer and the third electrode layer have substantially the same pattern in a plan view.

10. The liquid crystal display device according to claim 1,
    wherein the semiconductor layer comprises an oxide semiconductor layer, and
    wherein the oxide semiconductor layer comprises a crystal region which is c-axis-aligned perpendicularly to a surface of the oxide semiconductor layer.

11. The liquid crystal display device according to claim 5,
    wherein the semiconductor layer comprises an oxide semiconductor layer, and
    wherein the oxide semiconductor layer comprises a crystal region which is c-axis-aligned perpendicularly to a surface of the oxide semiconductor layer.

* * * * *

UNITED STATES PATENT AND TRADEMARK OFFICE
CERTIFICATE OF CORRECTION

PATENT NO. : 8,854,583 B2  Page 1 of 1
APPLICATION NO. : 13/075292
DATED : October 7, 2014
INVENTOR(S) : Daisuke Kubota It is certified that error appears in the above-identified patent and that said Letters Patent is hereby corrected as shown below:

In the Specification:

Col. 37, line 41, "FIGS. 5M, 5A2, and 5B" should read --FIGS. 5A1, 5A2, and 5B--.

In the Claims:

Col. 45, line 10, Claim 9, "claim 1," should read --claim 5,--.

Signed and Sealed this
Fourteenth Day of April, 2015

Michelle K. Lee
*Director of the United States Patent and Trademark Office*